(12) United States Patent
Greene et al.

(10) Patent No.: US 9,374,113 B2
(45) Date of Patent: Jun. 21, 2016

(54) METHOD AND APPARATUS FOR ADJUSTING THE TIMING OF RADIO ANTENNA TUNING

(71) Applicant: BlackBerry Limited, Waterloo (CA)

(72) Inventors: Matthew Greene, Crystal Lake, IL (US); Carsten Hoirup, Crystal Lake, IL (US); Keith Manssen, Bull Valley, IL (US)

(73) Assignee: BLACKBERRY LIMITED, Waterloo (CA)

(*) Notice: Subject to any disclaimer, the term of this patent is extended or adjusted under 35 U.S.C. 154(b) by 265 days.

(21) Appl. No.: 13/724,040

(22) Filed: Dec. 21, 2012

(65) Prior Publication Data

US 2014/0177686 A1    Jun. 26, 2014

(51) Int. Cl.
*H04B 1/04* (2006.01)
*H04B 1/18* (2006.01)
*H03F 1/56* (2006.01)

(52) U.S. Cl.
CPC ............. *H04B 1/0458* (2013.01); *H04B 1/18* (2013.01); *H03F 1/56* (2013.01)

(58) Field of Classification Search
CPC ................................ H04B 1/0458; H03F 1/56
USPC ............. 455/120, 121, 123, 125, 126, 276.1, 455/289
See application file for complete search history.

(56) References Cited

U.S. PATENT DOCUMENTS

| | | |
|---|---|---|
| 2,745,067 A | 8/1956 | True |
| 3,117,279 A | 1/1964 | Ludvigson |
| 3,160,832 A | 12/1964 | Beitman |
| 3,390,337 A | 6/1968 | Beitman |
| 3,443,231 A | 5/1969 | Roza |
| 3,509,500 A | 4/1970 | McNair |
| 3,571,716 A | 3/1971 | Hill |
| 3,590,385 A | 6/1971 | Sabo |
| 3,601,717 A | 8/1971 | Kuecken |
| 3,794,941 A | 2/1974 | Templin |
| 3,919,644 A | 11/1975 | Smolka |

(Continued)

FOREIGN PATENT DOCUMENTS

| | | |
|---|---|---|
| CN | 101640949 A | 2/2010 |
| DE | 19614655 | 10/1997 |

(Continued)

OTHER PUBLICATIONS

Bezooijen, A. et al., "A GSM/EDGE/WCDMA Adaptive Series-LC Matching Network Using RF-MEMS Switches", IEEE Journal of Solid-State Circuits, vol. 43, No. 10, Oct. 2008, 2259-2268.

(Continued)

*Primary Examiner* — Duc M Nguyen
(74) *Attorney, Agent, or Firm* — Guntin & Gust, PLC; Douglas Schnabel

(57) ABSTRACT

A system that incorporates teachings of the present disclosure may include, for example, determining, by a controller of a mobile communication device, a phase shift criteria and an amplitude shift criteria associated with a modulation being implemented by the mobile communication device. The controller can determine a group of tuning steps that satisfies the phase and amplitude shift criteria and that provides a desired tuning step for a matching network of the mobile communication device. Additional embodiments are disclosed.

20 Claims, 19 Drawing Sheets

(56) References Cited

U.S. PATENT DOCUMENTS

| | | |
|---|---|---|
| 3,990,024 A | 11/1976 | Hou |
| 3,995,237 A | 11/1976 | Brunner |
| 4,186,359 A | 1/1980 | Kaegebein |
| 4,201,960 A | 5/1980 | Skutta |
| 4,227,256 A | 10/1980 | O'Keefe |
| 4,383,441 A | 5/1983 | Willis |
| 4,476,578 A | 10/1984 | Gaudin |
| 4,493,112 A | 1/1985 | Bruene |
| 4,509,019 A | 4/1985 | Banu et al. |
| 4,777,490 A | 10/1988 | Sharma |
| 4,799,066 A | 1/1989 | Deacon |
| 4,965,607 A | 10/1990 | Wilkins |
| 4,980,656 A | 12/1990 | Duffalo |
| 5,032,805 A | 7/1991 | Elmer |
| 5,142,255 A | 8/1992 | Chang |
| 5,177,670 A | 1/1993 | Shinohara |
| 5,195,045 A | 3/1993 | Keane |
| 5,200,826 A | 4/1993 | Seong |
| 5,212,463 A | 5/1993 | Babbitt |
| 5,230,091 A | 7/1993 | Vaisanen et al. |
| 5,243,358 A | 9/1993 | Sanford |
| 5,258,728 A | 11/1993 | Taniyoshi |
| 5,276,912 A | 1/1994 | Siwiak |
| 5,301,358 A | 4/1994 | Gaskill |
| 5,307,033 A | 4/1994 | Koscica |
| 5,310,358 A | 5/1994 | Johnson |
| 5,312,790 A | 5/1994 | Sengupta |
| 5,334,958 A | 8/1994 | Babbitt |
| 5,361,403 A * | 11/1994 | Dent ................................ 455/74 |
| 5,371,473 A | 12/1994 | Trinh |
| 5,409,889 A | 4/1995 | Das |
| 5,427,988 A | 6/1995 | Sengupta |
| 5,430,417 A | 7/1995 | Martin |
| 5,446,447 A | 8/1995 | Carney |
| 5,448,252 A | 9/1995 | Ali |
| 5,451,567 A | 9/1995 | Das |
| 5,451,914 A | 9/1995 | Stengel |
| 5,457,394 A | 10/1995 | McEwan |
| 5,472,935 A | 12/1995 | Yandrofski |
| 5,479,139 A | 12/1995 | Koscica |
| 5,486,491 A | 1/1996 | Sengupta |
| 5,496,795 A | 3/1996 | Das |
| 5,502,372 A | 3/1996 | Quan |
| 5,524,281 A | 6/1996 | Bradley |
| 5,548,837 A | 8/1996 | Hess |
| 5,561,407 A | 10/1996 | Koscica |
| 5,564,086 A | 10/1996 | Cygan |
| 5,593,495 A | 1/1997 | Masuda |
| 5,635,433 A | 6/1997 | Sengupta |
| 5,635,434 A | 6/1997 | Sengupta |
| 5,640,042 A | 6/1997 | Koscica |
| 5,679,624 A | 10/1997 | Das |
| 5,689,219 A | 11/1997 | Piirainen |
| 5,693,429 A | 12/1997 | Sengupta |
| 5,694,134 A | 12/1997 | Barnes |
| 5,699,071 A | 12/1997 | Urakami |
| 5,721,194 A | 2/1998 | Yandrofski |
| 5,766,697 A | 6/1998 | Sengupta |
| 5,777,581 A | 7/1998 | Lilly |
| 5,778,308 A * | 7/1998 | Sroka et al. ................ 455/115.1 |
| 5,786,727 A | 7/1998 | Sigmon |
| 5,812,572 A | 9/1998 | King |
| 5,812,943 A | 9/1998 | Suzuki |
| 5,830,591 A | 11/1998 | Sengupta |
| 5,846,893 A | 12/1998 | Sengupta |
| 5,874,926 A | 2/1999 | Tsuru |
| 5,880,635 A | 3/1999 | Satoh |
| 5,886,867 A | 3/1999 | Chivukula |
| 5,892,482 A | 4/1999 | Coleman |
| 5,929,717 A | 7/1999 | Richardson |
| 5,940,030 A * | 8/1999 | Hampel et al. ................ 342/372 |
| 5,963,871 A | 10/1999 | Zhinong |
| 5,969,582 A | 10/1999 | Boesch |
| 5,982,099 A | 11/1999 | Barnes et al. |
| 5,990,766 A | 11/1999 | Zhang |
| 6,009,124 A | 12/1999 | Smith |
| 6,020,787 A | 2/2000 | Kim |
| 6,020,795 A | 2/2000 | Kim |
| 6,029,075 A | 2/2000 | Das |
| 6,045,932 A | 4/2000 | Jia |
| 6,061,025 A | 5/2000 | Jackson |
| 6,064,865 A | 5/2000 | Kuo et al. |
| 6,074,971 A | 6/2000 | Chiu |
| 6,096,127 A | 8/2000 | Dimos |
| 6,100,733 A | 8/2000 | Dortu |
| 6,101,102 A | 8/2000 | Brand |
| 6,125,266 A | 9/2000 | Matero et al. |
| 6,133,883 A | 10/2000 | Munson |
| 6,172,385 B1 | 1/2001 | Duncombe |
| 6,215,644 B1 | 4/2001 | Dhuler |
| 6,242,989 B1 | 6/2001 | Barber |
| 6,266,528 B1 | 7/2001 | Farzaneh |
| 6,281,748 B1 * | 8/2001 | Klomsdorf et al. .......... 330/129 |
| 6,281,847 B1 | 8/2001 | Lee |
| 6,343,208 B1 | 1/2002 | Ying |
| 6,377,142 B1 | 4/2002 | Chiu |
| 6,377,217 B1 | 4/2002 | Zhu |
| 6,377,440 B1 | 4/2002 | Zhu |
| 6,384,785 B1 | 5/2002 | Kamogawa |
| 6,404,614 B1 | 6/2002 | Zhu |
| 6,408,190 B1 | 6/2002 | Ying |
| 6,414,562 B1 | 7/2002 | Bouisse |
| 6,415,562 B1 | 7/2002 | Donaghue |
| 6,452,776 B1 | 9/2002 | Chakravorty |
| 6,461,930 B2 | 10/2002 | Akram |
| 6,466,774 B1 | 10/2002 | Okabe |
| 6,492,883 B2 | 12/2002 | Liang |
| 6,514,895 B1 | 2/2003 | Chiu |
| 6,525,630 B1 | 2/2003 | Zhu |
| 6,531,936 B1 | 3/2003 | Chiu et al. |
| 6,535,076 B2 | 3/2003 | Partridge et al. |
| 6,535,722 B1 | 3/2003 | Rosen et al. |
| 6,538,603 B1 | 3/2003 | Chen et al. |
| 6,556,102 B1 | 4/2003 | Sengupta et al. |
| 6,556,814 B1 | 4/2003 | Klomsdorf et al. |
| 6,570,462 B2 | 5/2003 | Edmonson et al. |
| 6,590,468 B2 | 7/2003 | du Toit et al. |
| 6,590,541 B1 | 7/2003 | Schultze |
| 6,597,265 B2 | 7/2003 | Liang et al. |
| 6,608,603 B2 | 8/2003 | Alexopoulos et al. |
| 6,624,786 B2 | 9/2003 | Boyle |
| 6,640,085 B1 | 10/2003 | Chatzipetros |
| 6,657,595 B1 | 12/2003 | Phillips |
| 6,661,638 B2 | 12/2003 | Jackson |
| 6,670,256 B2 | 12/2003 | Yang |
| 6,710,651 B2 | 3/2004 | Forrester |
| 6,724,611 B1 | 4/2004 | Mosley |
| 6,724,890 B1 | 4/2004 | Bareis |
| 6,737,179 B2 | 5/2004 | Sengupta |
| 6,747,522 B2 | 6/2004 | Pietruszynski et al. |
| 6,759,918 B2 | 7/2004 | Du Toit |
| 6,765,540 B2 | 7/2004 | Toncich |
| 6,768,472 B2 | 7/2004 | Alexopoulos |
| 6,774,077 B2 | 8/2004 | Sengupta |
| 6,795,712 B1 | 9/2004 | Vakilian |
| 6,825,818 B2 | 11/2004 | Toncich |
| 6,839,028 B2 | 1/2005 | Lee |
| 6,845,126 B2 | 1/2005 | Dent |
| 6,859,104 B2 | 2/2005 | Toncich |
| 6,862,432 B1 | 3/2005 | Kim |
| 6,864,757 B2 | 3/2005 | Du Toit |
| 6,868,260 B2 | 3/2005 | Jagielski |
| 6,882,245 B2 | 4/2005 | Utsunomiya |
| 6,888,714 B2 | 5/2005 | Shaw |
| 6,905,989 B2 | 6/2005 | Ellis |
| 6,906,653 B2 | 6/2005 | Uno |
| 6,907,234 B2 | 6/2005 | Karr |
| 6,920,315 B1 | 7/2005 | Wilcox et al. |
| 6,943,078 B1 | 9/2005 | Zheng |
| 6,946,847 B2 | 9/2005 | Nishimori |
| 6,949,442 B2 | 9/2005 | Barth |
| 6,961,368 B2 * | 11/2005 | Dent et al. .................... 375/219 |
| 6,964,296 B2 | 11/2005 | Memory |
| 6,965,837 B2 | 11/2005 | Vintola |

(56) References Cited

U.S. PATENT DOCUMENTS

| | | |
|---|---|---|
| 6,987,493 B2 | 1/2006 | Chen |
| 6,993,297 B2 | 1/2006 | Smith |
| 7,009,455 B2 | 3/2006 | Toncich |
| 7,071,776 B2 | 7/2006 | Forrester |
| 7,106,715 B1 | 9/2006 | Kelton |
| 7,107,033 B2 | 9/2006 | du Toit |
| 7,113,614 B2 | 9/2006 | Rhoads |
| 7,151,411 B2 | 12/2006 | Martin |
| 7,176,634 B2 | 2/2007 | Kitamura |
| 7,176,845 B2 | 2/2007 | Fabrega-Sanchez |
| 7,180,467 B2 | 2/2007 | Fabrega-Sanchez |
| 7,221,327 B2 | 5/2007 | Toncich |
| 7,298,329 B2 | 11/2007 | Diament |
| 7,299,018 B2 | 11/2007 | Van Rumpt |
| 7,312,118 B2 | 12/2007 | Kiyotoshi |
| 7,332,980 B2 | 2/2008 | Zhu |
| 7,332,981 B2 | 2/2008 | Matsuno |
| 7,339,527 B2 | 3/2008 | Sager |
| 7,426,373 B2 | 9/2008 | Clingman |
| 7,427,949 B2 | 9/2008 | Channabasappa et al. |
| 7,453,405 B2 | 11/2008 | Nishikido et al. |
| 7,468,638 B1 | 12/2008 | Tsai |
| 7,469,129 B2 | 12/2008 | Blaker et al. |
| 7,528,674 B2 | 5/2009 | Kato et al. |
| 7,535,080 B2 | 5/2009 | Zeng |
| 7,535,312 B2 | 5/2009 | McKinzie |
| 7,539,527 B2 | 5/2009 | Jang |
| 7,596,357 B2 | 9/2009 | Nakamata |
| 7,642,879 B2 | 1/2010 | Matsuno |
| 7,667,663 B2 | 2/2010 | Hsiao |
| 7,671,693 B2 | 3/2010 | Brobston et al. |
| 7,705,692 B2 | 4/2010 | Fukamachi et al. |
| 7,711,337 B2 | 5/2010 | McKinzie |
| 7,714,676 B2 | 5/2010 | McKinzie |
| 7,714,678 B2 | 5/2010 | du Toit et al. |
| 7,728,693 B2 | 6/2010 | du Toit et al. |
| 7,760,699 B1 | 7/2010 | Malik |
| 7,768,400 B2 | 8/2010 | Lawrence et al. |
| 7,795,990 B2 | 9/2010 | du Toit |
| 7,830,320 B2 | 11/2010 | Shamblin et al. |
| 7,852,170 B2 | 12/2010 | McKinzie |
| 7,856,228 B2 | 12/2010 | Lekutai et al. |
| 7,865,154 B2 | 1/2011 | Mendolia |
| 7,907,094 B2 | 3/2011 | Kakitsu et al. |
| 7,917,104 B2 | 3/2011 | Manssen et al. |
| 7,949,309 B2 | 5/2011 | Rofougaran |
| 7,969,257 B2 | 6/2011 | du Toit et al. |
| 7,983,615 B2 | 7/2011 | Bryce et al. |
| 7,991,363 B2 | 8/2011 | Greene |
| 8,170,510 B2 | 5/2012 | Knudsen et al. |
| 8,204,446 B2 | 6/2012 | Scheer |
| 8,217,731 B2 | 7/2012 | McKinzie et al. |
| 8,299,867 B2 | 10/2012 | McKinzie |
| 8,320,850 B1 * | 11/2012 | Khlat ........................... 455/107 |
| 8,325,097 B2 | 12/2012 | McKinzie, III et al. |
| 8,405,563 B2 | 3/2013 | McKinzie et al. |
| 8,421,548 B2 | 4/2013 | Spears et al. |
| 8,432,234 B2 | 4/2013 | Manssen et al. |
| 8,442,457 B2 | 5/2013 | Harel et al. |
| 8,457,569 B2 | 6/2013 | Blin |
| 8,472,888 B2 | 6/2013 | Manssen et al. |
| 8,558,633 B2 | 10/2013 | McKinzie, III |
| 8,564,381 B2 | 10/2013 | McKinzie |
| 8,594,584 B2 | 11/2013 | Greene et al. |
| 8,620,236 B2 | 12/2013 | Manssen et al. |
| 8,620,246 B2 | 12/2013 | McKinzie et al. |
| 8,620,247 B2 | 12/2013 | McKinzie et al. |
| 8,655,286 B2 | 2/2014 | Mendolia |
| 8,674,783 B2 | 3/2014 | Spears et al. |
| 8,680,934 B2 | 3/2014 | McKinzie et al. |
| 8,693,963 B2 | 4/2014 | du Toit et al. |
| 8,712,340 B2 | 4/2014 | Hoirup et al. |
| 8,787,845 B2 | 7/2014 | Manssen et al. |
| 8,957,742 B2 | 2/2015 | Spears et al. |
| 9,026,062 B2 | 5/2015 | Greene et al. |
| 9,119,152 B2 | 8/2015 | Blin |
| 2002/0008672 A1 | 1/2002 | Gothard et al. |
| 2002/0079982 A1 | 6/2002 | Lafleur et al. |
| 2002/0109642 A1 | 8/2002 | Gee et al. |
| 2002/0167963 A1 | 11/2002 | Joa-Ng |
| 2002/0183013 A1 | 12/2002 | Auckland et al. |
| 2002/0187780 A1 | 12/2002 | Souissi |
| 2002/0191703 A1 | 12/2002 | Ling |
| 2002/0193088 A1 | 12/2002 | Jung |
| 2003/0060227 A1 | 3/2003 | Sekine |
| 2003/0071300 A1 | 4/2003 | Yashima |
| 2003/0114124 A1 | 6/2003 | Higuchi |
| 2003/0193997 A1 | 10/2003 | Dent |
| 2003/0199286 A1 | 10/2003 | du Toit |
| 2003/0232607 A1 | 12/2003 | Le Bars |
| 2004/0009754 A1 | 1/2004 | Smith, Jr. et al. |
| 2004/0137950 A1 | 7/2004 | Bolin |
| 2004/0202399 A1 | 10/2004 | Kochergin |
| 2004/0227176 A1 | 11/2004 | York |
| 2004/0232982 A1 | 11/2004 | Ichitsubo et al. |
| 2004/0257293 A1 | 12/2004 | Friedrich |
| 2004/0263411 A1 | 12/2004 | Fabrega-Sanchez et al. |
| 2005/0032488 A1 | 2/2005 | Pehlke |
| 2005/0032541 A1 | 2/2005 | Wang |
| 2005/0042994 A1 | 2/2005 | Otaka |
| 2005/0059362 A1 | 3/2005 | Kalajo et al. |
| 2005/0082636 A1 | 4/2005 | Yashima |
| 2005/0085204 A1 | 4/2005 | Poilasne et al. |
| 2005/0093624 A1 * | 5/2005 | Forrester et al. ............... 330/129 |
| 2005/0130608 A1 | 6/2005 | Forse |
| 2005/0208960 A1 | 9/2005 | Hassan |
| 2005/0215204 A1 | 9/2005 | Wallace |
| 2005/0227627 A1 | 10/2005 | Cyr et al. |
| 2005/0227633 A1 | 10/2005 | Dunko |
| 2005/0259011 A1 | 11/2005 | Vance |
| 2005/0260692 A1 | 11/2005 | Nazrul et al. |
| 2005/0280588 A1 | 12/2005 | Fujikawa et al. |
| 2005/0282503 A1 | 12/2005 | Onno |
| 2006/0003537 A1 | 1/2006 | Sinha |
| 2006/0009165 A1 | 1/2006 | Alles |
| 2006/0030277 A1 | 2/2006 | Cyr et al. |
| 2006/0077082 A1 | 4/2006 | Shanks et al. |
| 2006/0099915 A1 | 5/2006 | Laroia et al. |
| 2006/0119511 A1 | 6/2006 | Collinson |
| 2006/0148415 A1 | 7/2006 | Hamalainen et al. |
| 2006/0160501 A1 | 7/2006 | Mendolia |
| 2006/0183433 A1 | 8/2006 | Mori et al. |
| 2006/0183442 A1 | 8/2006 | Chang et al. |
| 2006/0195161 A1 | 8/2006 | Li et al. |
| 2006/0281423 A1 | 12/2006 | Caimi |
| 2007/0001924 A1 | 1/2007 | Hirabayashi |
| 2007/0013483 A1 | 1/2007 | Stewart |
| 2007/0035458 A1 | 2/2007 | Ohba et al. |
| 2007/0042725 A1 | 2/2007 | Poilasne |
| 2007/0042734 A1 | 2/2007 | Ryu |
| 2007/0063788 A1 | 3/2007 | Zhu |
| 2007/0080888 A1 | 4/2007 | Mohamadi |
| 2007/0082611 A1 | 4/2007 | Terranova et al. |
| 2007/0085609 A1 | 4/2007 | Itkin et al. |
| 2007/0091006 A1 | 4/2007 | Thober et al. |
| 2007/0111681 A1 | 5/2007 | Alberth et al. |
| 2007/0142011 A1 | 6/2007 | Shatara |
| 2007/0142014 A1 | 6/2007 | Wilcox |
| 2007/0149146 A1 | 6/2007 | Hwang |
| 2007/0171879 A1 | 7/2007 | Bourque |
| 2007/0184825 A1 | 8/2007 | Lim et al. |
| 2007/0194859 A1 * | 8/2007 | Brobston et al. ............... 333/17.3 |
| 2007/0197180 A1 * | 8/2007 | McKinzie et al. ......... 455/248.1 |
| 2007/0200766 A1 | 8/2007 | McKinzie |
| 2007/0200773 A1 | 8/2007 | Dou et al. |
| 2007/0248238 A1 | 10/2007 | Abreu et al. |
| 2007/0285326 A1 | 12/2007 | McKinzie |
| 2008/0030165 A1 | 2/2008 | Lisac et al. |
| 2008/0055016 A1 | 3/2008 | Morris |
| 2008/0055168 A1 | 3/2008 | Massey et al. |
| 2008/0090539 A1 | 4/2008 | Thompson |
| 2008/0094149 A1 | 4/2008 | Brobston |
| 2008/0122553 A1 | 5/2008 | McKinzie |
| 2008/0122723 A1 | 5/2008 | Rofougaran |

(56) References Cited

U.S. PATENT DOCUMENTS

| | | |
|---|---|---|
| 2008/0158076 A1 | 7/2008 | Walley |
| 2008/0174508 A1 | 7/2008 | Iwai et al. |
| 2008/0261544 A1* | 10/2008 | Blin ............................ 455/121 |
| 2008/0274706 A1 | 11/2008 | Blin et al. |
| 2008/0285729 A1 | 11/2008 | Glasgow et al. |
| 2008/0294718 A1 | 11/2008 | Okano |
| 2008/0300027 A1 | 12/2008 | Dou et al. |
| 2008/0305750 A1 | 12/2008 | Alon et al. |
| 2008/0309617 A1 | 12/2008 | Kong et al. |
| 2009/0027286 A1 | 1/2009 | Ohishi |
| 2009/0039976 A1 | 2/2009 | McKinzie, III |
| 2009/0109880 A1 | 4/2009 | Kim et al. |
| 2009/0121963 A1 | 5/2009 | Greene |
| 2009/0149136 A1 | 6/2009 | Rofougaran |
| 2009/0184879 A1 | 7/2009 | Derneryd |
| 2009/0215446 A1 | 8/2009 | Hapsari et al. |
| 2009/0231220 A1 | 9/2009 | Zhang et al. |
| 2009/0253385 A1* | 10/2009 | Dent et al. ...................... 455/83 |
| 2009/0295651 A1 | 12/2009 | Dou et al. |
| 2009/0323572 A1 | 12/2009 | Shi et al. |
| 2010/0053009 A1 | 3/2010 | Rofougaran |
| 2010/0060531 A1 | 3/2010 | Rappaport |
| 2010/0073103 A1* | 3/2010 | Spears ..................... H03H 7/40 333/17.3 |
| 2010/0085260 A1 | 4/2010 | McKinzie |
| 2010/0085884 A1 | 4/2010 | Srinivasan et al. |
| 2010/0105425 A1 | 4/2010 | Asokan |
| 2010/0107067 A1 | 4/2010 | Vaisanen et al. |
| 2010/0134215 A1 | 6/2010 | Lee et al. |
| 2010/0156552 A1 | 6/2010 | McKinzie |
| 2010/0214189 A1 | 8/2010 | Kanazawa |
| 2010/0232474 A1 | 9/2010 | Rofougaran et al. |
| 2010/0244576 A1 | 9/2010 | Hillan et al. |
| 2010/0285836 A1 | 11/2010 | Horihata et al. |
| 2010/0302106 A1 | 12/2010 | Knudsen et al. |
| 2010/0304688 A1 | 12/2010 | Knudsen |
| 2011/0002080 A1 | 1/2011 | Ranta |
| 2011/0014879 A1 | 1/2011 | Alberth et al. |
| 2011/0043328 A1* | 2/2011 | Bassali ........................ 340/5.71 |
| 2011/0086600 A1 | 4/2011 | Muhammad |
| 2011/0086630 A1 | 4/2011 | Manssen et al. |
| 2011/0105023 A1 | 5/2011 | Scheer et al. |
| 2011/0116423 A1 | 5/2011 | Rousu et al. |
| 2011/0117863 A1 | 5/2011 | Camp, Jr. et al. |
| 2011/0117973 A1 | 5/2011 | Asrani et al. |
| 2011/0121079 A1 | 5/2011 | Lawrence et al. |
| 2011/0122040 A1 | 5/2011 | Wakabayashi et al. |
| 2011/0140982 A1 | 6/2011 | Ozden et al. |
| 2011/0183633 A1 | 7/2011 | Ohba et al. |
| 2011/0195679 A1 | 8/2011 | Lee et al. |
| 2011/0237207 A1 | 9/2011 | Bauder |
| 2011/0249760 A1 | 10/2011 | Chrisikos et al. |
| 2011/0281532 A1 | 11/2011 | Shin et al. |
| 2011/0299438 A1 | 12/2011 | Mikhemar et al. |
| 2011/0306310 A1 | 12/2011 | Bai |
| 2011/0309980 A1 | 12/2011 | Ali et al. |
| 2012/0051409 A1* | 3/2012 | Brobston et al. ............... 375/222 |
| 2012/0062431 A1 | 3/2012 | Tikka et al. |
| 2012/0075159 A1 | 3/2012 | Chang |
| 2012/0084537 A1 | 4/2012 | Indukuru et al. |
| 2012/0094708 A1 | 4/2012 | Park |
| 2012/0112851 A1 | 5/2012 | Manssen |
| 2012/0112852 A1 | 5/2012 | Manssen et al. |
| 2012/0119843 A1 | 5/2012 | du Toit et al. |
| 2012/0119844 A1 | 5/2012 | du Toit et al. |
| 2012/0214421 A1 | 8/2012 | Hoirup |
| 2012/0220243 A1 | 8/2012 | Mendolia |
| 2012/0243579 A1 | 9/2012 | Premakanthan et al. |
| 2012/0286586 A1 | 11/2012 | Balm |
| 2012/0293384 A1 | 11/2012 | Knudsen et al. |
| 2012/0295554 A1 | 11/2012 | Greene et al. |
| 2012/0295555 A1 | 11/2012 | Greene et al. |
| 2013/0005277 A1 | 1/2013 | Klomsdorf et al. |
| 2013/0052967 A1 | 2/2013 | Black et al. |
| 2013/0056841 A1 | 3/2013 | Hsieh et al. |
| 2013/0076579 A1 | 3/2013 | Zhang et al. |
| 2013/0076580 A1 | 3/2013 | Zhang et al. |
| 2013/0106332 A1 | 5/2013 | Williams et al. |
| 2013/0122829 A1 | 5/2013 | Hyvonen et al. |
| 2013/0137384 A1 | 5/2013 | Desclos et al. |
| 2013/0154897 A1 | 6/2013 | Sorensen et al. |
| 2013/0215846 A1 | 8/2013 | Yerrabommanahalli et al. |
| 2013/0293425 A1 | 11/2013 | Zhu et al. |
| 2013/0315285 A1 | 11/2013 | Black et al. |
| 2014/0002323 A1 | 1/2014 | Ali et al. |

FOREIGN PATENT DOCUMENTS

| | | |
|---|---|---|
| DE | 102009018648 A1 | 10/2010 |
| EP | 0685936 | 6/1995 |
| EP | 0909024 | 4/1999 |
| EP | 1079296 | 2/2001 |
| EP | 1137192 | 9/2001 |
| EP | 1298810 | 4/2006 |
| EP | 2214085 A2 | 8/2010 |
| EP | 2328233 | 6/2011 |
| EP | 2388925 A1 | 11/2011 |
| EP | 2424119 A1 | 2/2012 |
| JP | 03276901 | 3/1990 |
| JP | 9321526 | 12/1997 |
| JP | 10209722 | 8/1998 |
| JP | 2005-130441 | 5/2005 |
| KR | 100645526 | 11/2006 |
| KR | 10-0740177 | 7/2007 |
| WO | 01/71846 | 9/2001 |
| WO | 2006/031170 | 3/2006 |
| WO | 2008/030165 | 3/2008 |
| WO | 2009/064968 | 5/2009 |
| WO | 2009/108391 A1 | 9/2009 |
| WO | 2009/155966 | 12/2009 |
| WO | 2010028521 A1 | 3/2010 |
| WO | 2010121914 A1 | 10/2010 |
| WO | 2011/044592 | 4/2011 |
| WO | 2011/084716 | 7/2011 |
| WO | 2011/084716 A1 | 7/2011 |
| WO | 2011102143 A1 | 8/2011 |
| WO | 2011/133657 | 10/2011 |
| WO | 2011028453 | 10/2011 |
| WO | 2012/067622 | 5/2012 |
| WO | 2012/085932 | 6/2012 |

OTHER PUBLICATIONS

Du Toit, , "Tunable Microwave Devices With Auto Adjusting Matching Circuit", U.S. Appl. No. 13/302,617, filed Nov. 22, 2011.

Du Toit, , "Tunable Microwave Devices With Auto-Adjusting Matching Circuit", U.S. Appl. No. 13/302,649, filed Nov. 22, 2011.

Greene, , "Method and Apparatus for Tuning a Communication Device", U.S. Appl. No. 13/108,463, filed May 16, 2011.

Greene, , "Method and Apparatus for Tuning a Communication Device", U.S. Appl. No. 13/108,589, filed May 16, 2011.

Hoirup, , "Method and Apparatus for Radio Antenna Frequency Tuning", U.S. Appl. No. 13/030,177, filed Feb. 18, 2011.

Hyun, S. , "Effects of strain on the dielectric properties of tunable dielectric SrTi03 thin films", Applied Physics Letters, 2004 American Institute of Physics.

Ida, I. et al., "An Adaptive Impedance Matching System and Its Application to Mobile Antennas", TENCON 2004, IEEE Region 10 Conference, See Abstract ad p. 544, Nov. 21-24, 2004, 543-547.

Manssen, "Method and Apparatus for Managing Interference in a Communication Device", U.S. Appl. No. 61/326,206, filed Apr. 20, 2010.

Manssen, , "Method and Apparatus for Tuning Antennas in a Communication Device", U.S. Appl. No. 12/941,972, filed Nov. 8, 2010.

Manssen, , "Method and Apparatus for Tuning Antennas in a Communication Device", U.S. Appl. No. 13/005,122, filed Jan. 12, 2011.

McKinzie, , "Adaptive Impedance Matching Module (AIMM) Control Architectures", U.S. Appl. No. 13/293,544, filed Jan. 10, 2011.

McKinzie, , "Adaptive Impedance Matching Module (AIMM) Control Architectures", U.S. Appl. No. 13/293,550, filed Nov. 10, 2011.

McKinzie, , "Method and Apparatus for Adaptive Impedance Matching", U.S. Appl. No. 13/217,748, filed Aug. 25, 2011.

(56) References Cited

OTHER PUBLICATIONS

Mendolia, , "Method and Apparatus for Tuning a Communication Device", U.S. Appl. No. 13/035,417, filed Feb. 25, 2011.
Paratek Microwave, Inc., , "Method and Appartus for Tuning Antennas in a Communication Device", International Application No. PCT/US11/59620; Filed Nov. 7, 2011.
Patent Cooperation Treaty, , "International Search Report and Written Opinion", International Application No. PCT/US2010/046241, Mar. 2, 2011.
Patent Cooperation Treaty, , "International Search Report and Written Opinion", International Application No. PCT/US2010/056413, Jul. 27, 2011.
Patent Cooperation Treaty, , "International Search Report and Written Opinion", PCT Application No. PCT/US08/005085, Jul. 2, 2008.
Payandehjoo, Kasra , "Novel Techniques for Coupling Reduction in Multi-Antenna Hand-held Devices", IEEE Student Member, 1-8.
Pervez, N.K. , "High Tunability barium strontium titanate thin films for RF circuit applications", Applied Physics Letters, 2004 American Institute of Physics.
Petit, Laurent , "MEMS-Switched Parasitic-Antenna Array for Radiation Pattern Diversity", IEEE Transactions on Antennas and Propagation, vol. 54, No. 9, Sep. 2009, 2624-2631.
Qiao, et al., "Antenna Impedance Mismatch Measurement and Correction for Adaptive COMA Transceivers", IEEE, 2005.
Qiao, et al., "Measurement of Antenna Load Impedance for Power Amplifiers", The Department of Electrical and Computer Engineering, University of California, San Diego, Sep. 13, 2004.
Spears, , "Methods for Tuning an Adaptive Impedance Matching Network With a Look-Up Table", U.S. Appl. No. 13/297,951, filed Nov. 16, 2011.
Stemmer, Susanne , "Low-loss tunable capacitors fabricated directly on gold bottom electrodes", University of California Postprints 2006.
Taylor, T.R. , "Impact of thermal strain on the dielectric constant of sputtered barium strontium titanate thin films", Applied Physics Letters, 2002 American Institute of Physics.
Tombak, Ali , "Tunable Barium Strontium Titanate Thin Film Capacitors for RF and Microwave Applications", IEEE Microwave and Wireles Components Letters, Vol, 12, Jan 2002.
Xu, Hongtao , "Tunable Microwave Integrated Circuits using BST Thin Film Capacitors with Device", Integrated Ferroelectrics, Department of Electrical Engineering and Computer Engineering, University of California, 2005.
Zuo, S. , "Eigenmode Decoupling for Mimo Loop-Antenna Based on 180 Coupler", Progress in Electromagnetics Research Letters, vol. 26, 2011, 11-20.
Payandehjoo, Kasra et al., "Investigation of Parasitic Elements for Coupling Reduction in MultiAntenna Hand-Set Devices", Published online Jan. 22, 2013 in Wiley Online Library (wileyonlinelibrary.com).

\* cited by examiner

400

500

510

520

700

100

LOOK-UP TABLE

| RAT 1; Modulation type 1; phase/amp shift limits; tuning steps |
|---|
| RAT 1; Modulation type 2; phase/amp shift limits; tuning steps |
| ⋮ |
| RAT 1; Modulation type n; phase/amp shift limits; tuning steps |
| RAT 2; Modulation type 1; phase/amp shift limits; tuning steps |
| RAT 2; Modulation type 2; phase/amp shift limits; tuning steps |
| ⋮ |
| RAT 2; Modulation type n; phase/amp shift limits; tuning steps |
| |
| RAT N; Modulation type 1; phase/amp shift limits; tuning steps |
| RAT N; Modulation type 2; phase/amp shift limits; tuning steps |
| ⋮ |
| RAT N; Modulation type N; phase/amp shift limits; tuning steps |

LOOK-UP TABLE

| |
|---|
| Band 1; Use Case 1; Desired tuning state |
| Band 1; Use Case 2; Desired tuning state |
| ⋮ |
| Band 1; Use Case n; Desired tuning state |
| Band 2; Use Case 1; Desired tuning state |
| Band 2; Use Case 2; Desired tuning state |
| ⋮ |
| Band 2; Use Case n; Desired tuning state |
| |
| Band N; Use Case 1; Desired tuning state |
| Band N; Use Case 2; Desired tuning state |
| ⋮ |
| Band N; Use Case n; Desired tuning state |

2000

FIG. 20

METHOD AND APPARATUS FOR ADJUSTING THE TIMING OF RADIO ANTENNA TUNING

FIELD OF THE DISCLOSURE

The present disclosure relates to a method and apparatus for impedance tuning and in particular adjusting the timing of the tuning.

BACKGROUND

Existing multi-frequency wireless devices (e.g., radios) use an antenna structure that attempts to radiate at optimum efficiency over the entire frequency range of operation, but can really only do so over a subset of the frequencies. Due to size constraints, and aesthetic design reasons, the antenna designer is forced to compromise the performance in some of the frequency bands.

Many existing radios use a simple circuit composed of fixed value components that are aimed at improving the power transfer from power amplifier to antenna, or from the antenna to the receiver, but since the components used are fixed in value there is always a compromise when attempting to cover multiple frequency bands and multiple use cases.

BRIEF DESCRIPTION OF THE DRAWINGS

FIGS. 19-20 depict an illustrative embodiments of look-up tables that can be utilized by the communication devices of FIGS. 1 and 13;

DETAILED DESCRIPTION

Figure 1:
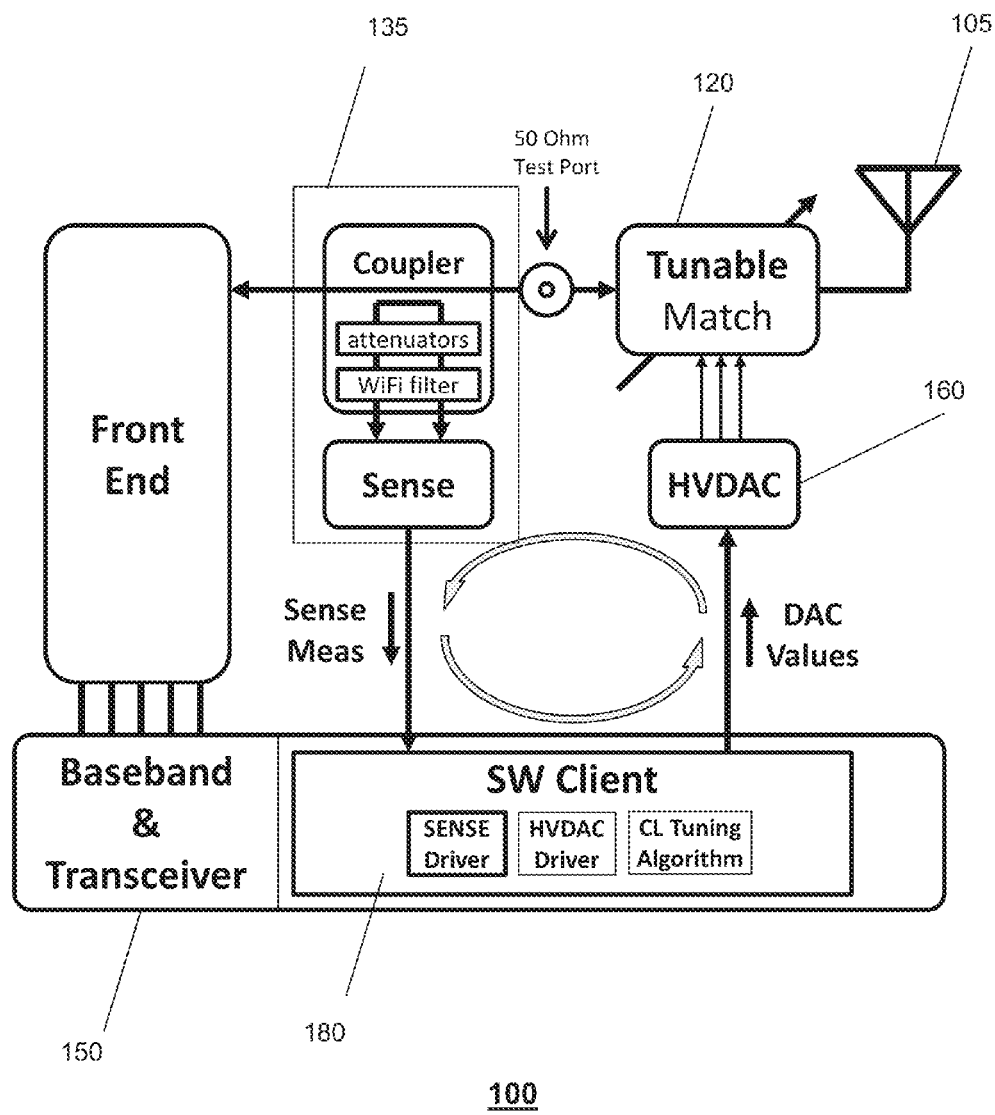
FIG. 1 depicts an illustrative embodiment of a portion of a communication device that can generate multiple tuning steps to achieve a desired tuning value.

The subject disclosure provides a method and apparatus for radio antenna tuning. One or more exemplary embodiments can generate a series of smaller tuning steps to correspond to a desired tuning step and a desired tuning value, where the smaller tuning steps reduce or eliminate undesired conditions, such as bit errors, degradation of signal, and so forth.

In one embodiment, a mobile communication device can include an antenna, a transceiver coupled with the antenna, and a matching network coupled with the transceiver and the antenna, where the matching network includes a variable reactance element. The communication device can also include a controller coupled with the matching network, where the controller determines a desired tuning step to be applied to the matching network to adjust a variable reactance of the variable reactance element. The controller can determine a phase shift criteria associated with a modulation being implemented by the mobile communication device. The controller can select a group of tuning steps that satisfies the phase shift criteria and that provides the desired tuning step.

In one embodiment, a method includes determining, by a controller of a mobile communication device, a phase shift criteria and an amplitude shift criteria associated with a modulation being implemented by the mobile communication device. The method can include determining a group of tuning steps that satisfies the phase and amplitude shift criteria and that provides a desired tuning step for a matching network of the mobile communication device.

In one embodiment, a mobile communication device can include a memory storing a look-up table, where the look-up table is indexed based on a modulation type. The mobile communication device can include a matching network having a voltage tunable capacitor, and a controller coupled with the memory and the matching network. The controller can determine a desired tuning step to be applied to the matching network to adjust a variable capacitance of the voltage tunable capacitor. The controller can determine maximum phase and amplitude shift limits associated with a modulation being implemented by the mobile communication device based on the look-up table. The controller can generate control signals representative of a group of tuning steps that does not exceed the maximum phase and amplitude shift limits and that provides the desired tuning step.

One or more exemplary embodiments can perform tuning in code division multiplex access (CDMA) and/or other continuous transmission systems, where the nature of the system necessitates making tuning changes while the carrier is active.

In one embodiment, a method can include determining an adjustment to be made to an impedance matching network of a communication device that is utilizing CDMA communication where the adjustment is determined by a processor of the communication device, and adjusting the impedance matching network while the communication device is performing receiving or transmitting signals, where the tuning is distributed over a group of tuning steps that are selected to satisfy desired operational criteria, such as a maximum allowable phase and/or amplitude shift limit.

Referring to FIG. 1, a portion of a communication device 100 is illustrated having an antenna 105 coupled with a transceiver 150 and with a matching network 120. Other components can also be utilized, such as a front end, baseband, test port, attenuators, WiFi filters, and so forth.

The tunable matching network 120 allows for or otherwise enables tuning and/or detuning of the antenna(s) 105 through tuning steps applied to one or more variable reactance elements of the matching network. The variable reactance element(s) can be of various types, numbers and/or configurations. For example, the variable reactance element(s) can be one or more of a capacitor with a tunable dielectric constant, and/or a capacitor of a fixed capacitance controlled by one or more micro-electromechanical systems (MEMS) switches, one or more mechanical switches, and/or one or more semiconductor switches that enable impedance tuning. The one or more variable reactance elements can also be other types of components that have a variable and adjustable reactance that enables the impedance tuning. Matching network 120 is illustrated as a separate network that is connected along a path between the antenna and the transceiver, such as at a feed or input/output port of the antenna. However, the matching network 120 can be an on-antenna tuning matching network, such that the tunable element(s) are connected (e.g., directly) with radiating elements or a portion thereof of the antenna 105 (or with one or more antennas of the communication device 100). In another embodiment, multiple matching networks (e.g., a first matching network connected at the antenna feed and a second matching network connected directly to one or more of the radiating elements of the antenna 105) can be utilized by the communication device 100. Other components that can be utilized for adjusting of a tuning network in the exemplary embodiments are described in U.S. Pat. No. 7,714,676 to McKinzie, the disclosure of which is hereby incorporated by reference.

In this exemplary embodiment, there is one antenna 105, however, multiple antennas can also be utilized such as a transmit/receive antenna and a diversity reception antenna. The exemplary embodiments can utilize other numbers, types and/or configurations of antennas with device 100. For instance, antennas can be spatially diverse, pattern diverse, polarization diverse and/or adaptive array antennas. One or more of the exemplary embodiments can also be other types of multiple antenna systems, such as a MIMO (multiple-input and multiple output) system. The multiple antenna embodiments can be utilized for improving communications, such as through switching or selecting techniques, including analyzing noise in the multiple signals and selecting the most appropriate signal. The multiple antennas can also be used with combining techniques where the signals can be added together, such as equal gain combining or maximal-ratio combining. Other techniques for utilizing multiple signals from multiple antennas are also contemplated by the exemplary embodiments, including dynamic systems that can adjust the particular techniques being utilized, such as selectively applying a switching technique and a combination technique. The particular position(s) of the antenna(s) can vary and can be selected based on a number of factors, including being in close enough proximity to couple RF energy with each other.

Communication device 100 can include a measurement or detector component 135 for measuring or otherwise determining parameters associated with the antenna 105. For instance, the parameters can include the RSSI, phase, amplitude, and so forth associated with the antenna 105. In one embodiment, the detector 135 can include a directional coupler (e.g., coupled between the front end and the matching network 120, although other configurations can also be utilized) and other components (e.g., diode detectors, log-amp detectors, measurement receiver and so forth) that measure the desired parameter(s) and provides the parameters for analysis by a controller 180. The controller 180 can be various types of devices, such as a micro-controller or other component executing software. Communication device 100 is illustrated with a separate detector 135 and controller 180 where both components are coupled with the matching network 120 as well as coupled with each other. However, one or more of the exemplary embodiments can utilize other configurations of components in order to acquire and analyze operational parameter(s) of the antenna 105 (or other device parameters), such as integrating the detector 135 and the controller 180 into a single component.

In one or more embodiments, the controller 180 can perform an algorithm for determining a desired tuning step or value to be applied to the matching network 120. For example, the controller 180 can perform a closed loop tuning algorithm based on the operational parameter(s) obtained by the detector 135 to determine the desired tuning step. The exemplary embodiments can also utilize other algorithms for determining the desired tuning step, including an open-loop algorithm (e.g., based on a use case of the communication device 100) or a combination of open-loop and closed-loop. In one or more embodiments, the controller 180 can identify or otherwise determine a use case for the communication device based on operational parameter(s) of the communication device 100. In another embodiment, the use case can be determined without user input and/or without mechanical sensors detecting a mechanical configuration (such as slider out) of the communication device. However, the exemplary embodiments can include any combination of these techniques (including user input and/or mechanical sensors) for determining the use case of the communication device 100.

In one or more embodiments, the controller 180 can perform or otherwise facilitate impedance tuning via the matching network 120 by dividing (equally and/or unequally) the desired tuning step into a group of tuning steps. The group of steps can increase (or decrease) by the same amount or can increase (or decrease) by different amounts. Each tuning step of the group of tuning steps can be selected or otherwise determined based on satisfying operational criteria that reduce or eliminate degradation of the signal, bit errors, and other undesired conditions. For example, the operational criteria can be one or both of a phase and amplitude shift criteria, such as a maximum phase shift limit and/or a maximum amplitude shift limit that are allowed for each step of the group of tuning steps that when aggregated provide the desired tuning step or value. In one or more embodiments, the operational criteria can be based on avoiding, during the tuning process, violation of system specifications, such as adjacent channel leakage ratio requirements, error vector magnitude requirements, and/or bit error rate requirements. In one or more embodiments, the selection of the operational criteria can be based on the Radio Access Technology (RAT), the modulation type, data speed, and so forth.

In one or more embodiments, the selection of the group of tuning steps is based on a look-up table (e.g., table 1900 of FIG. 19) that provides tuning information based on modulation type. The tuning information of table 1900 can include tuning limits and/or tuning steps that are indexed based on radio access technology and modulation type. For instance, table 1900 can indicate that the group of tuning steps for a 16QAM modulation type is to be limited by 12 degrees and 0.25 dB while the group of tuning steps for a 64QAM modulation type is to be limited by 5 degrees and 0.25 dB in order to avoid an undesired level of symbol error. In another example of table 1900, the table can indicate that the group of tuning steps for a 16QAM modulation type is to be limited by 10 degrees and 0.25 dB while the group of tuning steps for a 64QAM modulation type is to be limited by 6 degrees and 0.25 dB in order to avoid an undesired level of error vector magnitude. In one embodiment, multiple tables can be stored that are based on different undesired conditions (such as symbol error, error vector magnitude, bit error rate, adjacent channel leakage ratio, and so forth) and that are indexed based on modulation type. In another embodiment, a single table can be stored that provides for the most constrained limitation from amongst the undesired conditions so that the group of tuning steps can avoid all of the undesired conditions. In one or more embodiments, the tuning limits from table 1900 can be used in an algorithm that determines the group of tuning steps to be utilized in order to achieve the desired tuning value within a given time period (such as within a single slot). The algorithm can generate equal tuning steps that achieve these goals or can generate unequal steps (including distinguishing between the size of the steps based on various factors including gradually increasing the step size, taking larger steps initially, and so forth)

In this example, table 1900 includes empirical data for the operational criteria (e.g., the maximum allowable phase and amplitude shifts) which can be obtained through testing under various conditions, including using different modulation schemes and/or under various use cases. The empirical data can be pre-determined information that is collected during the development of the communication device for provisioning to the communication device. In one or more embodiments, table 1900 can be updated based on modifications to modulation schemes, changes to operational requirements (e.g., a service provider's standards change), new modulation schemes, and so forth, where additional testing can be performed based on the new operational circumstances and the new operational criteria (such as changes to the maximum allowable phase and amplitude shifts) can be provisioned to the mobile communication device for use during impedance tuning.

In one or more embodiments, the communication device 100 can include a Digital-to-Analog Converter (DAC), such as a High-Voltage DAC (HVDAC) 160, coupled with the matching network 120 and the controller 180 so that the HVDAC can receive control signals from the controller and can provide bias signals to the matching network for adjusting the variable reactance element(s) to correspond to the group of tuning steps. The exemplary embodiments can also utilize other components, with or without the HVDAC 160, for generating and providing control signals that cause the matching network 120 to adjust the variable reactance of the variable reactance element(s).

Figure 2:
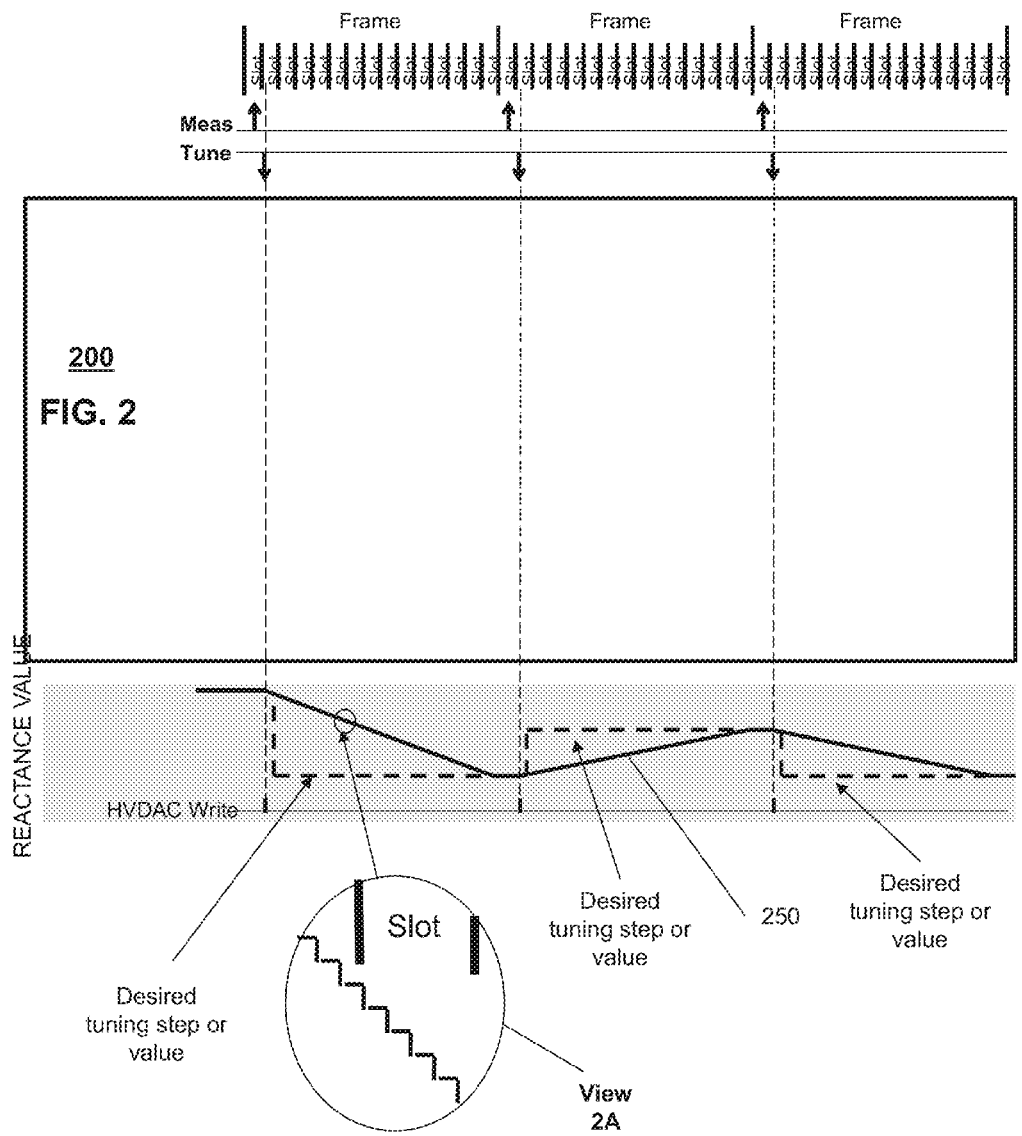
FIGS. 2-4 depicts illustrative embodiments of timing diagrams showing tuning techniques that can be performed by the communication device of FIG. 1.

Referring additionally to FIG. 2, a timing diagram 200 is illustrated that depicts an example of impedance tuning performed by the communication device 100. In this embodiment, the HVDAC 160 can receive a control signal that includes a rate of tuning adjustment from the controller 180, which enables the HVDAC to generate bias voltages corresponding to the group of tuning steps based on the received rate of tuning adjustment. For example, the controller 180 can perform a single write command (that includes the rate of tuning adjustment) to the HVDAC 160 (such as per frame although other timing techniques can also be utilized) that enables multiple different bias voltages to be generated by the HVDAC and applied to the matching network 120. In this embodiment, the single write command can implement the desired tuning (utilizing multiple smaller tuning steps) without the need for multiple write commands. In one embodiment, the controller 180 implements the impedance tuning based on the rate of tuning adjustment responsive to detecting or otherwise determining an absence of a frequency change in the communications.

The rate of tuning adjustment in this exemplary embodiment can enable the HVDAC 160 to be incremented or decremented at a constant rate (e.g., one LSB each cycle—although other increments or decrements can be used) responsive to the received write command until the desired tuning step or value is achieved. In this example, there can be multiple steps of the group of tuning steps applied during each slot of the frame resulting in a larger number of tuning steps being utilized than the number of slots of the frame. The particular number of tuning steps of the group of tuning steps that are utilized can vary and can be based on numerous factors, including one or more of the operational criteria (e.g., maximum allowed phase and/or amplitude shifts) that limits the tuning steps, the type of modulation being performed by the communication device 100, the amount of the overall desired tuning step, and so forth. In this embodiment, measurement information, such as operational parameter(s) from the detector 135, can be received by the controller 180, such as at the beginning of the frame in the first slot, and the controller 180 can write the rate of tuning adjustment command to the HVDAC 160 in the second slot of the frame that causes the HVDAC to commence generating bias voltages that adjust the variable reactance of the matching network 120.

As shown in FIG. 2, a gradual tuning can be performed (as depicted by the descending or ascending sloped line 250) based on the HVDAC write commands which eventually provides the desired tuning step or value. In this example, tuning is performed for each frame, however, the exemplary embodiments can utilize other timing configurations for the write commands and the tuning, including the rate of tuning adjustment causing the gradual tuning over multiple frames and/or the rate of tuning adjustment causing the gradual tuning over less than an entire frame. As shown in the enlarged view 2A, each slot of the frame can be provided with multiple tuning steps which facilitates the gradual tuning over the frame (or a portion thereof) to the desired tuning value. The output is essentially digitally ramped by incrementing or decrementing the DAC. The digital ramp can be smoothed by applying an RC filter. Some tunable capacitors employ resistive bias circuits, so when the DAC drives the tunable capacitor it already sees an RC load that will smooth the ramp. Smoothing the digital ramp is advantageous because the output will more closely approximate a linear response over a given time slot. If the transition is smoothed and has a nearly linear phase response versus time, then the receiver will see the impairment as frequency error. The frequency error can be compensated for by the receiver, whereas abrupt discontinuities in the phase cannot be compensated for and must be limited. While the illustrated embodiment depicts the operational parameter(s) being received in a first slot and the write command being performed in a second slot, the exemplary embodiments can obtain the operational parameter(s) or other information for determining the desired tuning step and/or perform the write commands at various slots of the frames. In one embodiment, the rate of tuning adjustment can be determined so as to satisfy the operational criteria (e.g., the maximum allowed phase and/or amplitude shifts) and to extend the tuning over the entire frame or nearly the entire frame so as to provide a smoother and more gradual transition between tuning values as opposed to a single step tuning technique which may cause a larger phase and/or amplitude shift during a frame slot than desired.

Figure 3:
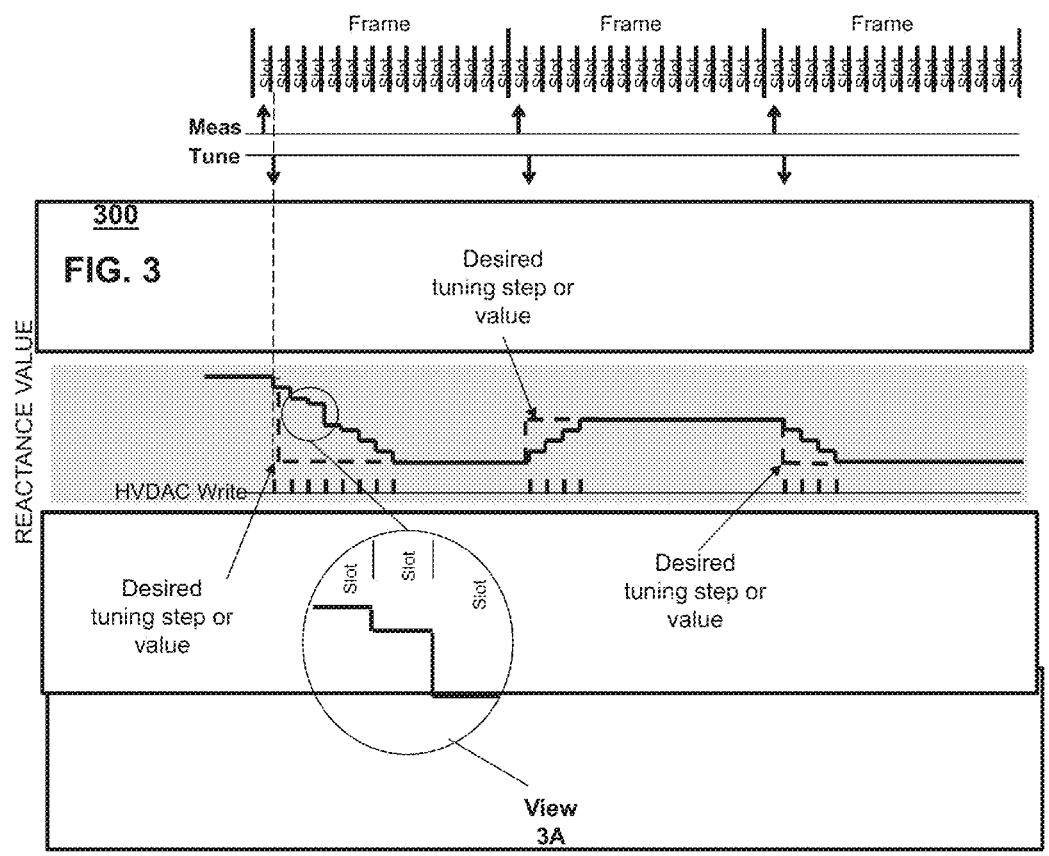

Other techniques and/or components can be utilized for dividing the desired tuning step into smaller tuning steps. As an example and referring to FIG. 3 illustrating a timing diagram 300, the controller 180 can perform multiple write commands to the HVDAC 160 that indicate each step of the group of tuning steps that are to be utilized so that the HVDAC generates a bias voltage responsive to each write command which adjusts the matching network 120 accordingly. In one or more embodiments, one or more of the steps of the group of tuning steps can be of different step sizes, but still subject to the operational criteria (e.g., limited as to maximum phase and/or amplitude shift). In one or more embodiments, each of the group of tuning steps can be of the same step size. As can be seen in timing diagram 300, the controller 180 provides control signals to the HVDAC 160 causing the matching network 160 to be tuned to a desired tuning value by utilizing smaller tuning steps where some of those steps sizes are not equal as shown in the enlarged view 3A. The example of FIG. 3, illustrates tuning that can be achieved based on multiple write commands in a single frame where the desired tuning value is obtained during the frame, such as in the first frame approximately half-way through the frame. Timing diagram 300 also illustrates that the group of tuning steps utilized for achieving the desired tuning value in the second frame can be tuning steps having an equal step size. In the second frame, as well as the third frame, of the timing diagram 300, the desired tuning value is achieved earlier in the frame (after four write commands). The particular timing of achieving the desired tuning value can vary depending on a number of factors, such as the amount of tuning to be performed, the operational criteria, and so forth.

Figure 4:
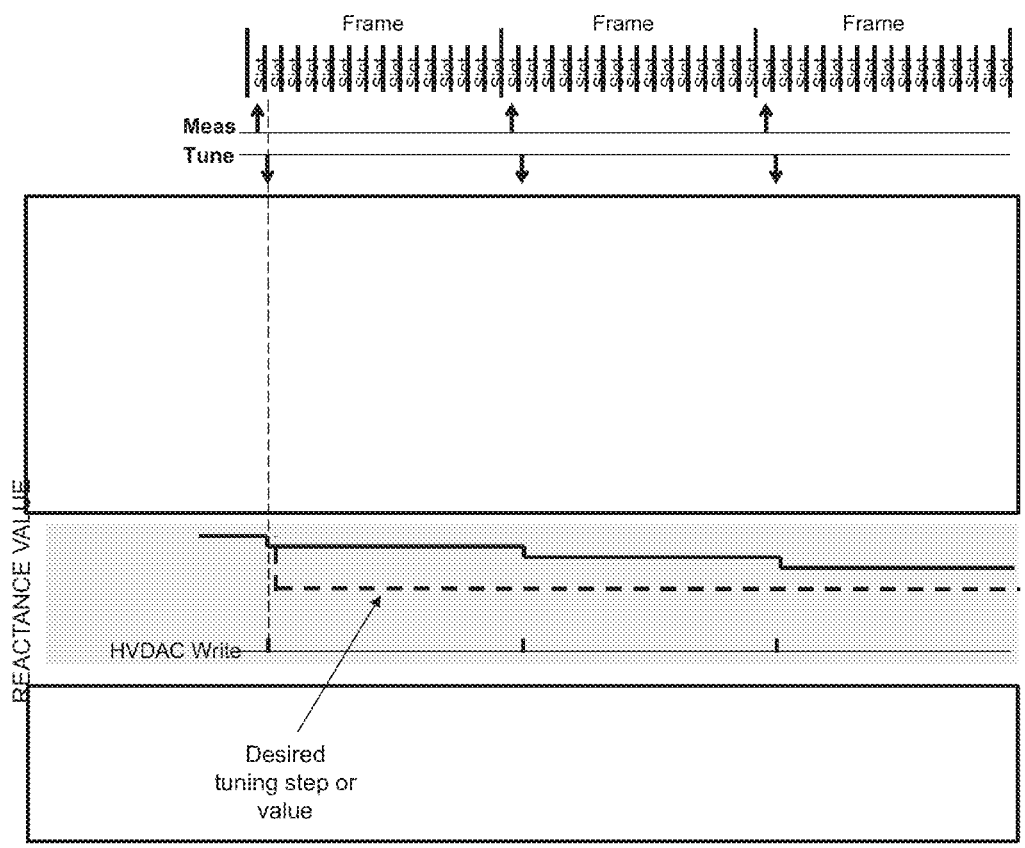

As another example and referring to FIG. 4 illustrating a timing diagram 400, the controller 180 can perform a single write command to the HVDAC 160 per frame so that the HVDAC generates a bias voltage responsive to each write command which adjusts the matching network 120 accordingly over multiple frames. The step sizes over each of the frames can be equal and/or can be of different step sizes, but still subject to the operational criteria (e.g., limited as to maximum phase and/or amplitude shift). The example of FIG. 4, illustrates tuning that can be achieved based on multiple write commands over multiple frames where the desired tuning value is obtained over multiple frames. The particular timing of achieving the desired tuning value, such as the number of frames over which the tuning is performed, can vary depending on a number of factors, including the amount of tuning to be performed, the operational criteria, the modulation type, and so forth.

Changing a matching network at an antenna while a wireless device is operating may, in some instances, result in performance degradation when done while the receiver or transmitter is active. In Time-Division Multiplex Access (TDMA) systems, such as GSM, one exemplary embodiment of the present disclosure can avoid, or otherwise compensate for, the degradation based on the receiver and transmitter being switched on and off, and there being times at which neither are active. This exemplary embodiment can utilize the inactive time period for changing the antenna's matching network without impacting, or otherwise reducing the impact on, the transmitted or received signal during the transition. However, in continuous carrier systems, such as Code-Division Multiplex Access (CDMA) systems (e.g., UMTS) as illustrated in timing diagram 400, there are fewer or in some cases no times when the receiver or transmitter is inactive.

The tuning states in FIG. 4 can be changed while the communication device 100 is transmitting and/or receiving such as, for example, in a WCDMA technology.

In one embodiment of FIG. 4, each radio frame can have a small duration (e.g., 10 ms), which can cause the exemplary method to evaluate for any necessary tuning and change the tuning state incrementally, such as once per frame. The amount the tuning network is changed for each frame can be determined by the amount of distortion of the RF signal caused by the reactance change and how much distortion can be tolerated by the communication device 100, including based on the allowable phase and amplitude shifts. In one embodiment, a sufficiently small change per frame can result in a negligible amount of distortion in the signal, such as, for example, but not limited to, less than or equal to 8 DAC steps per change. A small delay in changing the tuning state during the frame (e.g., commencing the tuning in the second slot) can result from the measurement and tuning analysis occurring at the beginning of the frame. It should further be understood that the exemplary embodiments can include frames in which there is no change in tuning state and thus no change in the capacitance or other reactance value. For instance, there can be one or more frames in which the capacitance or other reactance value has been adjusted, which are adjacent to one or more frames in which the capacitance or other reactance value has not changed.

Figure 5:
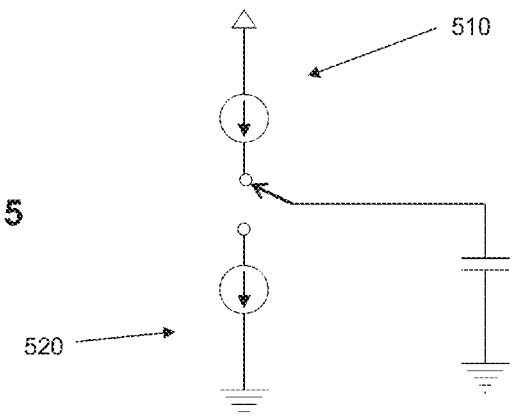
FIGS. 5, 6A and 6B depict an illustrative embodiment of a discrete circuit that can be used with the communication device of FIG. 1 for providing a ramp output voltage to control the transition of impedance tuning.
Figure 6A:
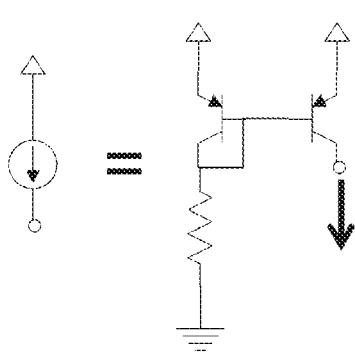
Figure 6B:
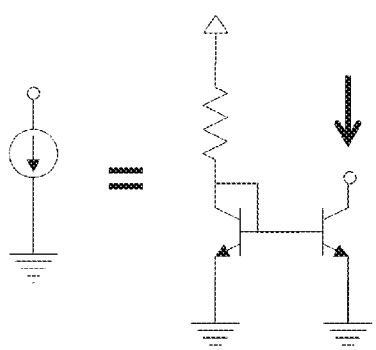

As another example, the group of smaller tuning steps can be generated to achieve the desired tuning step or value through use of an analog ramp output voltage which can adjust the transition of the tuning. One advantage of an analog ramp is the output can be smooth and approximately linear. Various techniques and components can be utilized to implement the analog ramp output voltage to control the transition of tuning. For example and referring to FIGS. 5, 6A and 6B, a discrete circuit is illustrated as one example for achieving the ramped voltage, although it should be understood that various other circuit configurations can be utilized for achieving the ramped voltage. Circuit 500 can either source or sink a constant current to charge or discharge a capacitor. A constant current into a capacitor can create a ramp voltage of constant dV/dt slope. The slope will be determined by the magnitude of the current sourced (or sunk) and the capacitor value. Since for a capacitor, I=C dV/dt, the slope (dV/dt) will therefore be I(in amperes)/C(in farads). The constant current source 510 can utilize a current mirror circuit such that the current sourced from the open pin is equal in magnitude to the current through the resistor. The current is set by (Vsupply−Vbe)/R. The constant current sink 520 can use a current mirror circuit such that the current sunk into the open pin is equal in magnitude to the current through the resistor. The current is set by (Vsupply−Vbe)/R.

Figure 6C:
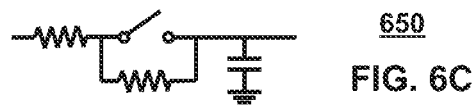
FIGS. 6C and 6D depict an illustrative embodiment of a discrete circuit that can be used with the communication device of FIG. 1 for providing or otherwise approximating a linear or near-linear impedance tuning.
Figure 6D:
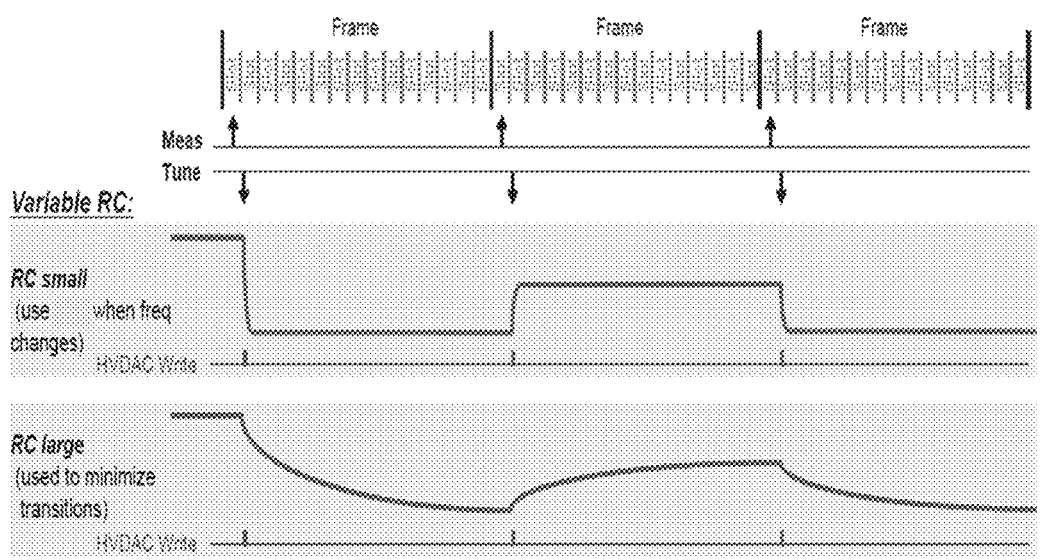
Figure 6E:
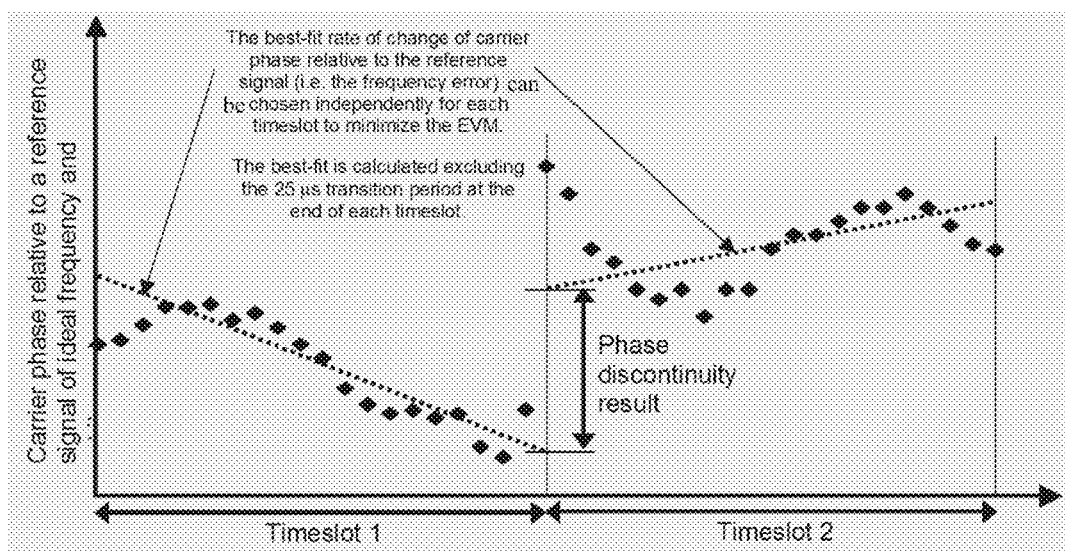
FIG. 6E graphically represents a linear phase shift being tuned out.

Referring to FIGS. 6C-D, a variable RC filter 650 can be used for providing or otherwise approximating a linear or near-linear response as shown in timing diagrams 600. In one or more embodiments, the variable RC filter 650 can provide a smaller RC value when the frequency changes (e.g., only when the frequency changes). In one or more embodiments, the RC filter 650 can provide a larger RC value to minimize transitions. As an example, the variable RC filter 650 can be adjusted for fast transitions when tuning between active periods of discontinuous transmission, such as TDD or frequency changes in FDD. As another example, the variable RC filter 650 can be adjusted for slow transitions during continuous transmission, such as closed loop tuning in FDD. FIG. 6E is an exemplary illustration of how linear phase shift can be tuned out by the receiver as frequency error. It should be understood that variable RC filter 650 is one example of a variable RC filter that can be utilized, and other configurations and components can also be utilized in addition to or in place of filter 650.

As another example, an adjustable R-C time constant can be utilized to determine an adjustment of a transition between steps of the group of tuning steps to achieve the desired tuning step or value. The use of the adjustable R-C time constant enables slowing down of the transition (e.g., on an analog basis) while allowing a faster transition if the circumstances permit. The adjustable R-C time constant can achieve the desired tuning step within a single frame and/or can achieve the desired tuning step over multiple frames.

Figure 7:
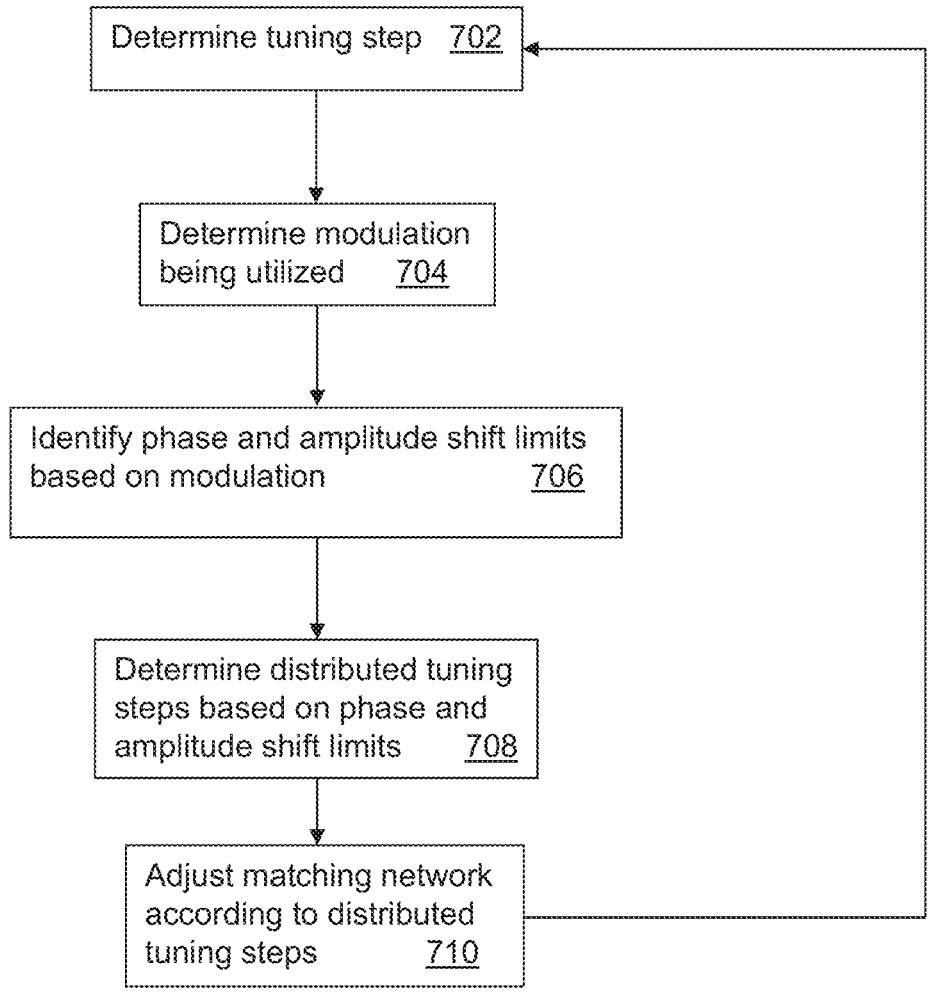
FIG. 7 depicts an exemplary method operating in portions of the communication device of FIG. 1 for controlling impedance tuning.

FIG. 7 depicts an illustrative method 700 that may be operated in portions of the communication device 100. The method 700 is intended to be an example of how a desired tuning step can be partitioned or otherwise divided into multiple tuning steps so that the transition between tuning values does not result in undesired conditions or so that the undesired conditions are reduced during tuning. Method 700 can be practiced with more or less of the steps described herein, and can be practiced by devices and components other than those described with respect to the exemplary embodiments. At 702, a desired tuning step or value can be identified or otherwise determined, such as by the controller 180. For example, an open loop process can be applied in which a use case of the communication device 100 is determined or detected and that use case is mapped to a desired tuning step or value, such as in a look-up table stored in the communication device. In another example, the desired tuning step or value can be determined based on a closed-loop process, such as obtaining operational parameters as feedback and analyzing those operational parameters to determine the desired tuning step or value. The particular operational parameters utilized in the closed-loop process can vary and can include forward and return power (e.g., measured via a detector including a directional coupler), as well as other metrics that are measured and/or determined.

At 704, the controller 180 can determine or otherwise identify a modulation type or scheme that is being implemented by the communication device 100, such as QPSK, 16QAM, 64QAM, and so forth. At 706, the controller can identify operational criteria that are to be applied in selecting a group of tuning steps, where the operational criteria are identified based on the type of modulation being implemented. For example, the operational criteria can include a maximum allowable phase shift and/or a maximum allowable amplitude shift for each tuning step of the group of tuning steps. In one embodiment, the identification of the operational criteria can be based on a look-up table that has empirical data for the operational criteria mapped to the modulation types. For example, the empirical data can be collected during development of the communication device 100 based on testing where phase and amplitude limits are identified which correspond to undesired conditions, such as bit or symbol errors, and so forth. The empirical data can indicate the maximum allowable phase and/or amplitude shift that should be used for a given time period (such as a slot of a radio frame) in order to avoid an unacceptable level of the undesired condition.

At 708, the operational criteria, such as the maximum allowable phase and/or amplitude shifts, can be utilized by the controller 180 to generate control signals that correspond with a group of tuning steps which do not violate the operational criteria. For example, the controller 180 can generate a control signal that includes a rate of tuning adjustment which provides for bias voltages that will not exceed the phase and/or amplitude shift limits. The rate of tuning adjustment can be forwarded to the HVDAC 160 as a write command which enables the HVDAC to generate a series of bias voltages which are incremented or decremented based on the rate of tuning adjustment, where the series of bias voltages all satisfy the phase and/or amplitude shift limits. The controller 180 can also utilize other techniques, based on the operational criteria, to determine or otherwise select the group of tuning steps that will satisfy the operational criteria while also achieving the desired tuning step. For example, the controller 180 can perform multiple write commands to the HVDAC 160 during a single frame resulting in unequal tuning steps being applied by the matching network 120. At 710, the matching network 710 can be adjusted based on the group of tuning steps, in which each step satisfies the operational criteria, as opposed to a single tuning step that may not satisfy the operational criteria. Method 700 can be repeated over the duration of the communication session, particularly to account for changes in the user environment or use case which changes the impedance load for the communication device 100. The group of tuning steps can include a series of tuning steps, such as a larger step broken up into a series of steps that satisfy desired parameters, such as phase and/or magnitude shift limits.

Figure 8:
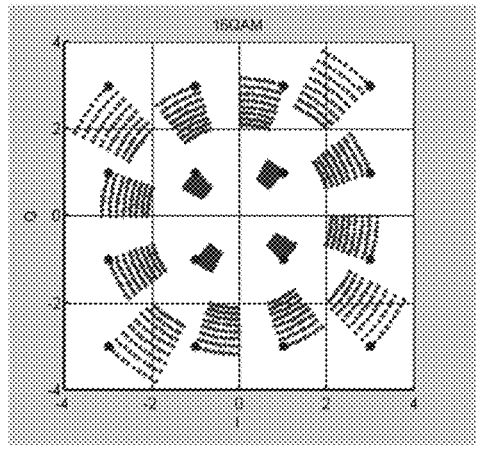
FIGS. 8-11 depict graphical representations of exemplary phase and amplitude error with respect to symbol error and error vector magnitude.
Figure 9:
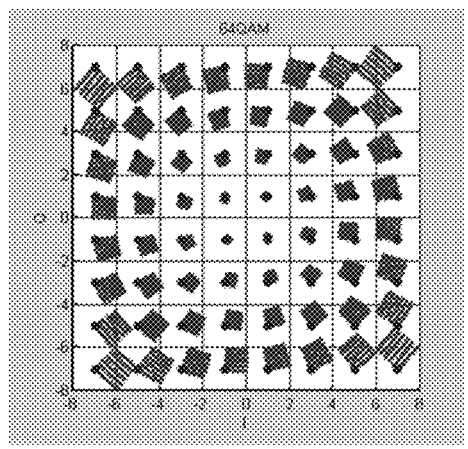
Figure 10:
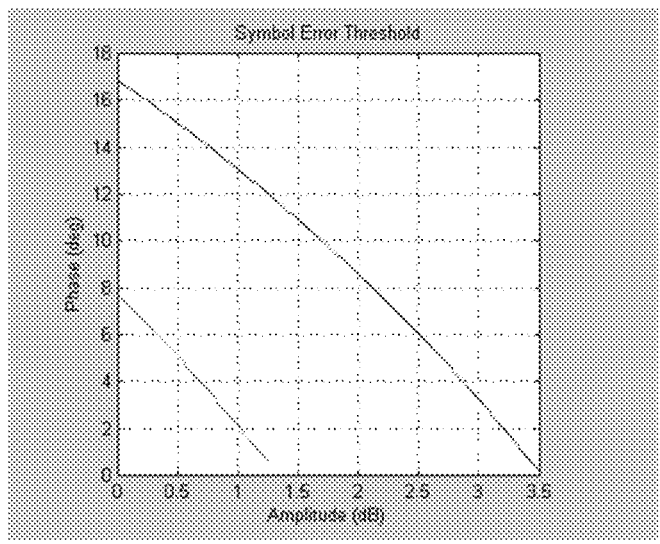
Figure 11:
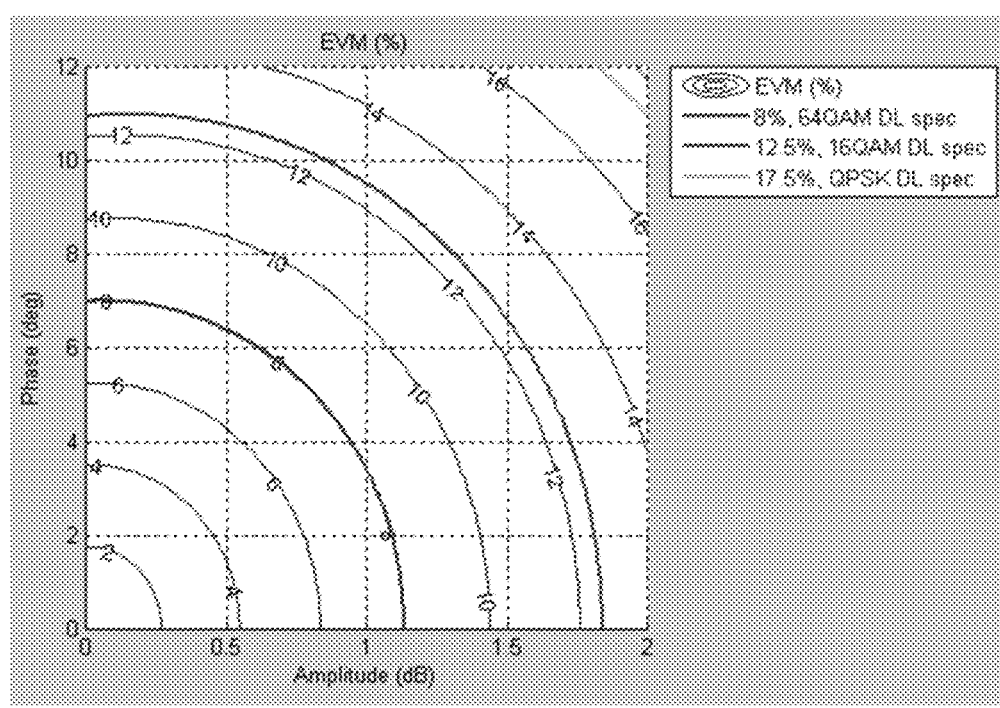

FIGS. 8-11 illustrate errors that may be generated based on tuning too rapidly due to large amplitude and phase shifts. FIG. 8 illustrates symbol errors for a 16QAM modulation as a function of amplitude error and phase error, where the worst case symbols are on the perimeter of the graph. FIG. 9 illustrates symbol errors for a 64QAM modulation as a function of amplitude error and phase error, where the worst case symbols are on the perimeter of the graph. FIG. 10 illustrates symbol error threshold for the 16QAM and 64QAM modulation. FIG. 11 illustrates Error Vector Magnitude (EVM) thresholds as a function of amplitude error and phase error with respect to a downlink specification. The EVM thresholds are for QPSK, 16QAM and 64QAM modulations and indicate specific values of phase and amplitude shift limits that should be applied during tuning to avoid EVM problems and maintain compliance with the EVM specification for downlink. It should be understood that FIGS. 8-11 are exemplary based on modulation types, specific criteria and requirements, and can vary depending on a number of factors, including variations in a service provider's requirements and/or the link budget of the radio.

Figure 12:
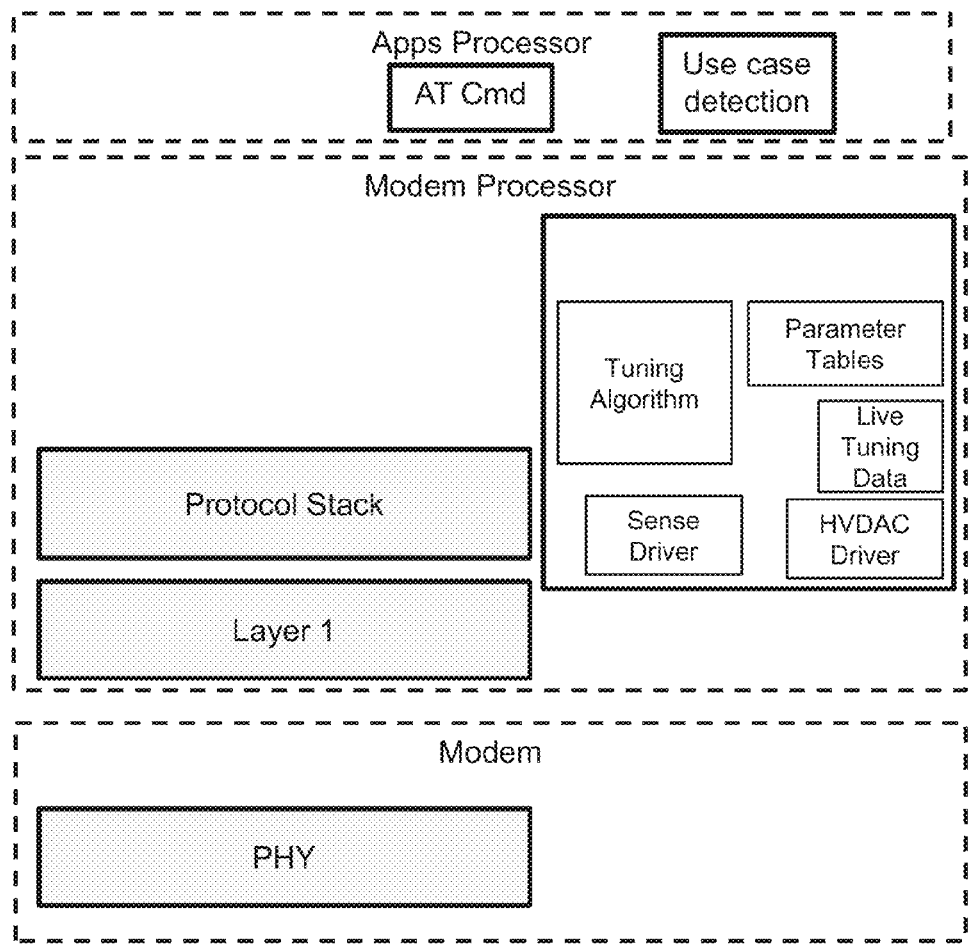
FIG. 12 depicts processes being executed by the communication devices of FIG. 1.

FIG. 12 illustrates processes that can be executed by the communication device 100 in order to obtain a desired tuning step and apply the desired tuning step in a series of smaller tuning steps that satisfy certain operational criteria, such as maximum allowable phase shift and/or maximum allowable amplitude shift. The AT Command is a test interface for setting HVDACs and characterization of the tuner and sense function. The Use Case Detection is a process for detecting or otherwise determining use cases to assist the tuning algorithm when it runs in an open loop mode. The Tuning Algorithm determines the desired tuning step or value such as in an open-loop and/or closed-loop process, and can be source code provisioned to the communication device 100. The Sense Driver facilitates obtaining operational parameters that are obtained, such as by the detector 135, and which are used in a closed-loop process for determining the desired tuning step or value. The Live Tuning Data is utilized as a link between the HVDAC and the tuning algorithm. The HVDAC Driver facilitates generating bias voltages to be applied according to the group of tuning steps. The Parameter Tables can include various information, such as an open-loop tuning table and/or an operational criteria table.

Figure 13:
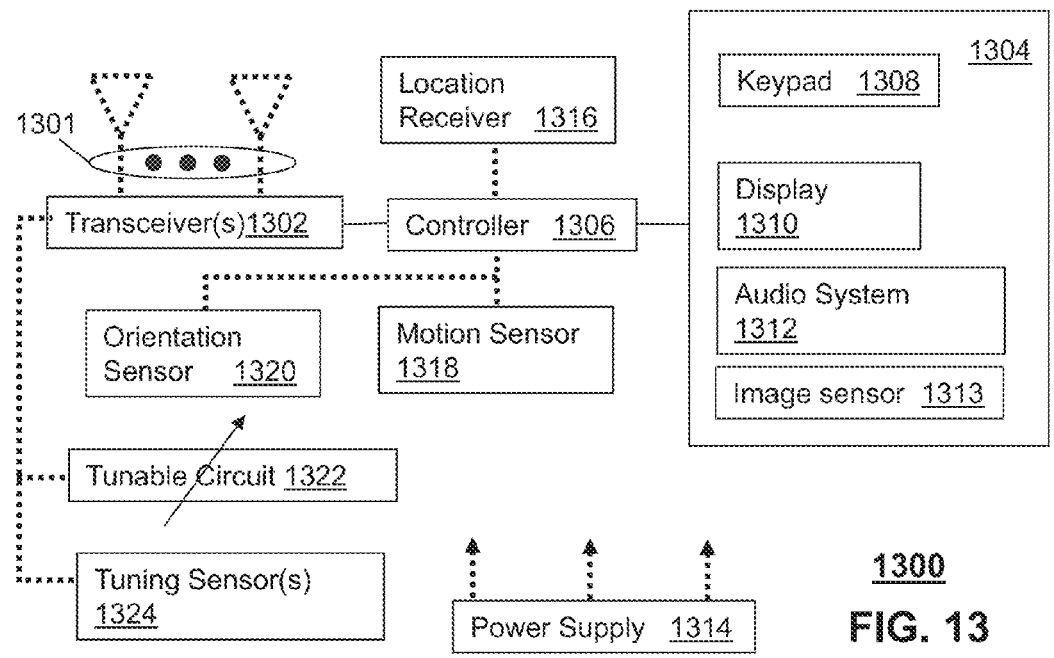
FIG. 13 depicts an illustrative embodiment of a communication device that can include one or more of the components of FIG. 1 and that can generate multiple tuning steps to achieve a desired tuning value.

FIG. 13 depicts an illustrative embodiment of a communication device 1300. Communication device 1300 can include one or more antennas 1301 coupled with a controller 1306 that can determine a desired tuning step or value and which can generate a group of tuning steps to achieve the desired tuning value. The group of tuning steps can be determined or otherwise selected so as to satisfy operational criteria to reduce or eliminate undesired conditions during tuning. The operational criteria can include, among other requirements, a maximum allowable phase shift and/or a maximum allowable amplitude shift. The communication device 1300 can comprise one or more transceivers 1302 coupled to the antenna 1301 (each transceiver having transmitter and receiver sections (herein transceiver 1302)), a tunable circuit or matching network 1322, one or more tuning sensors 1324, a user interface (UI) 1304, a power supply 1314, a location receiver 1316, a motion sensor 1318, an orientation sensor 1320, and the controller 1306 for managing operations thereof. The tuning sensor(s) 1324 can be used for detecting the operational parameters associated with the antenna 1301 and/or detecting other operational parameters that can be used in a tuning algorithm. The transceiver 1302 can support short-range or long-range wireless access technologies such as Bluetooth, ZigBee, WiFi, DECT, or cellular communication technologies, just to mention a few. Cellular technologies can include, for example, CDMA-1X, UMTS/HSDPA, GSM/GPRS, TDMA/EDGE, EV/DO, WiMAX, SDR, LTE, as well as other next generation wireless communication technologies as they arise. The transceiver 1302 can also be adapted to support circuit-switched wireline access technologies (such as PSTN), packet-switched wireline access technologies (such as TCP/IP, VoIP, etc.), and combinations thereof.

The tunable circuit 1322 can comprise variable reactive elements such as variable capacitors, variable inductors, or combinations thereof that are tunable with digital and/or analog bias signals based in part on the selected group of tuning steps that satisfy the operational criteria and that achieve the desired tuning value in a desired amount of time (e.g., within a single frame). The tunable circuit 1322 can represent a tunable matching network coupled to the antenna(s) 1301 to compensate for a change in impedance of the antenna(s) 1301, a compensation circuit to compensate for mutual coupling in a multi-antenna system, an amplifier tuning circuit to control operations of an amplifier of the transceiver 1302, a filter tuning circuit to alter a pass band of a filter of the transceiver 1302, and so on. The tuning sensors 1324 can be placed at any stage of the transceiver 1302 such as before or after a matching network 1402 shown in FIG. 14. The tuning sensors or detectors 1324 can utilize any suitable sensing technology or components including directional couplers, voltage dividers, or other sensing technologies to measure signals at any stage of the transceiver 1302. The measured signals can be provided to the controller 1306 by way of analog-to-digital converters included in the tuning sensors 1324 for processing and tuning a variable reactance of the tunable circuit 1322.

The UI 1304 can include a depressible or touch-sensitive keypad 1308 with a navigation mechanism such as a roller ball, a joystick, a mouse, or a navigation disk for manipulating operations of the communication device 1300. The keypad 1308 can be an integral part of a housing assembly of the communication device 1300 or an independent device operably coupled thereto by a tethered wireline interface (such as a USB cable) or a wireless interface supporting, for example, Bluetooth. The keypad 1308 can represent a numeric keypad commonly used by phones, and/or a QWERTY keypad with alphanumeric keys. The UI 1304 can further include a display 1310 such as monochrome or color LCD (Liquid Crystal Display), OLED (Organic Light Emitting Diode) or other suitable display technology for conveying images to an end user of the communication device 1300. In an embodiment where the display 1310 is touch-sensitive, a portion or all of the keypad 1308 can be presented by way of the display 1310 with navigation features.

The display 1310 can use touch screen technology to also serve as a user interface for detecting user input. As a touch screen display, the communication device 1300 can be adapted to present a user interface with graphical user interface (GUI) elements that can be selected by a user with a touch of a finger. The touch screen display 1310 can be equipped with capacitive, resistive or other forms of sensing technology to detect how much surface area of a user's finger has been placed on a portion of the touch screen display. This sensing information can be used to control the manipulation of the GUI elements or other functions of the user interface. The display 1310 can be an integral part of the housing assembly of the communication device 1300 or an independent device communicatively coupled thereto by a tethered wireline interface (such as a cable) or a wireless interface. In one or more embodiments, the GUI can enable a user to input information that facilitates determining the desired tuning value, such as providing a present use case.

The UI 1304 can also include an audio system 1312 that utilizes audio technology for conveying low volume audio (such as audio heard in proximity of a human ear) and high volume audio (such as speakerphone for hands free operation). The audio system 1312 can further include a microphone for receiving audible signals of an end user. The audio system 1312 can also be used for voice recognition applications. The UI 1304 can further include an image sensor 1313 such as a charged coupled device (CCD) camera for capturing still or moving images.

The power supply 1314 can utilize common power management technologies such as replaceable and rechargeable batteries, supply regulation technologies, and/or charging system technologies for supplying energy to the components of the communication device 1300 to facilitate long-range or short-range portable applications. Alternatively, or in combination, the charging system can utilize external power sources such as DC power supplied over a physical interface such as a USB port or other suitable tethering technologies.

The location receiver 1316 can utilize location technology such as a global positioning system (GPS) receiver capable of assisted GPS for identifying a location of the communication device 1300 based on signals generated by a constellation of GPS satellites, which can be used for facilitating location services such as navigation. The motion sensor 1318 can utilize motion sensing technology such as an accelerometer, a gyroscope, or other suitable motion sensing technology to detect motion of the communication device 1300 in three-dimensional space. The orientation sensor 1320 can utilize orientation sensing technology such as a magnetometer to detect the orientation of the communication device 1300 (north, south, west, and east, as well as combined orientations in degrees, minutes, or other suitable orientation metrics).

The communication device 1300 can use the transceiver 1302 to also determine a proximity to or distance to cellular, WiFi, Bluetooth, or other wireless access points by sensing techniques such as utilizing a received signal strength indicator (RSSI) and/or signal time of arrival (TOA) or time of flight (TOF) measurements. The controller 1306 can utilize computing technologies such as a microprocessor, a digital signal processor (DSP), and/or a video processor with associated storage memory such as Flash, ROM, RAM, SRAM, DRAM or other storage technologies for executing computer instructions, controlling, and processing data supplied by the aforementioned components of the communication device 1300.

Other components not shown in FIG. 13 are contemplated by the subject disclosure. The communication device 1300 can include a slot for inserting or removing an identity module such as a Subscriber Identity Module (SIM) card. SIM cards can be used for identifying and registering for subscriber services, executing computer programs, storing subscriber data, and so forth. The communication device 1300 as described herein can operate with more or less of the circuit components shown in FIG. 13. It is further noted that communication device 1300 be an integral part of consumer or industrial devices such as cellular phones, computers, laptops, tablets, utility meters, telemetry measurement devices, and so on.

In one or more embodiments, the controller 1306 can perform antenna tuning for the antenna 1301 (via adjusting the matching networks 1322) based on a use case. The use case can be utilized in an open-loop tuning algorithm (e.g., selecting tuning values for one or more variable reactances based on a look up table or other stored values mapped to the use case) and/or can be utilized in conjunction with a closed-loop algorithm (e.g., the use case can be a parameter of the algorithm that also relies upon operational parameters of the communication device, such as output power of the transmitter, return loss, received power, current drain and/or transmitter linearity). In one or more embodiments, the pre-defined tuning states, which are mapped to the use cases, can be determined during product development or manufacture based on empirical data and can be used as the desired tuning value. For example, empirical data can be stored in a look-up table that is based on a desired TRP and/or TIS, and which can be indexed based on use cases. In this example, the empirical data can be obtained through testing under various conditions, including under various use cases. In another embodiment, the empirical data can be indexed (e.g., in combination with the use cases) based on other factors including operating frequency, device mode of operation, device operating metrics, and so forth. In another embodiment, the empirical data of the look-up table can be based on desired Uplink (UL) and/or Downlink (DL) throughput, which can be indexed based on use cases. This process enables the communication device 1300 to determine a desired tuning step or value and then to break the desired tuning step or value into a group of tuning steps to avoid undesired conditions that can occur when impedance tuning is performed to rapidly.

Figure 14:
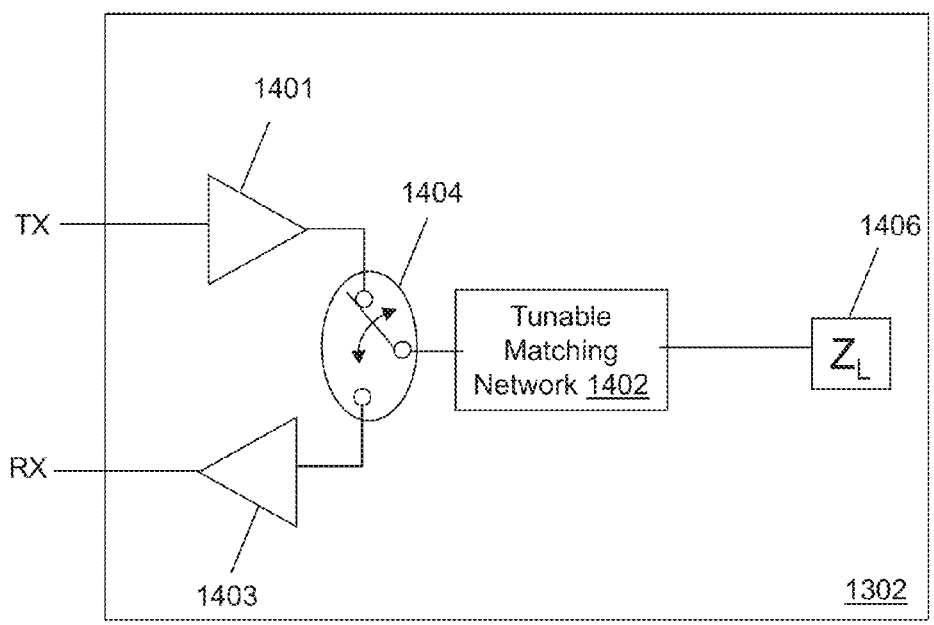
FIG. 14 depicts an illustrative embodiment of a portion of a transceiver of the communication device of FIG. 13.

FIG. 14 depicts an illustrative embodiment of a portion of the wireless transceiver 1302 of the communication device 1300 of FIG. 13. In one embodiment, such as for GSM applications, the transmit and receive portions of the transceiver 1302 can include amplifiers 1401, 1403 coupled to a tunable matching network 1402 and an impedance load 1406 by way of a switch 1404. The load 1406 in the present illustration can include the antenna as shown in FIG. 13 (herein antenna 1406). A transmit signal in the form of a radio frequency (RF) signal (TX) can be directed to the amplifier 1401 which amplifies the signal and directs the amplified signal to the antenna 1406 by way of the tunable matching network 1402 when switch 1404 is enabled for a transmission session. The receive portion of the transceiver 1302 can utilize a pre-amplifier 1403 which amplifies signals received from the antenna 1406 by way of the tunable matching network 1402 when switch 1404 is enabled for a receive session. Other configurations of FIG. 13 are possible for other types of cellular access technologies, such as CDMA. These undisclosed configurations are contemplated by the present disclosure.

Figure 15:
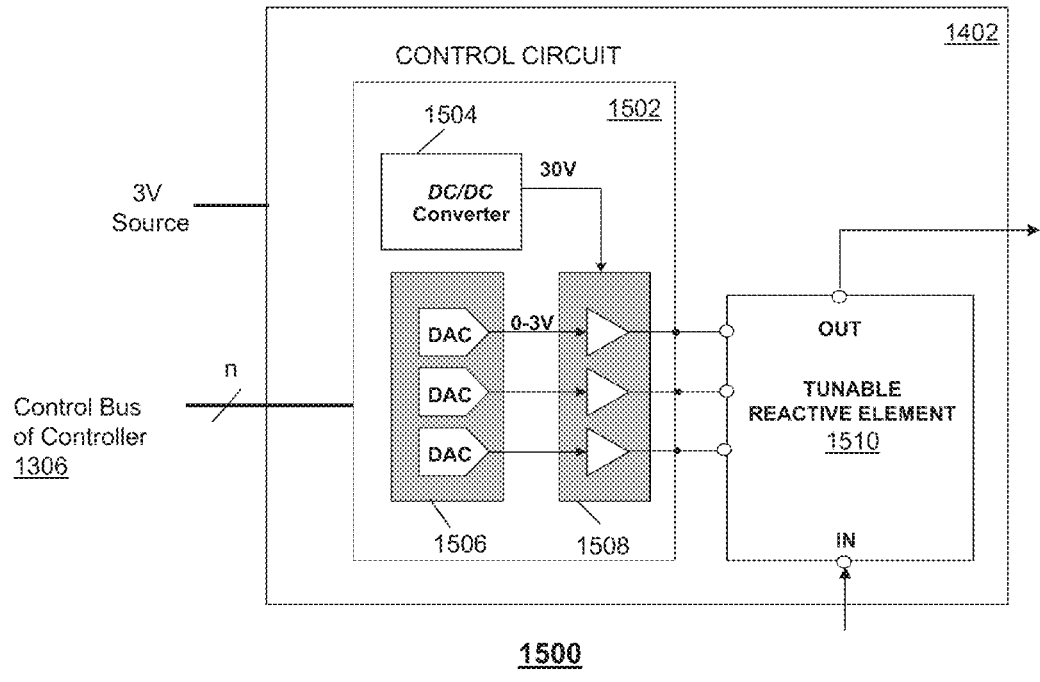
FIGS. 15-16 depict illustrative embodiments of a tunable matching network of the transceiver of FIG. 14.
Figure 16:
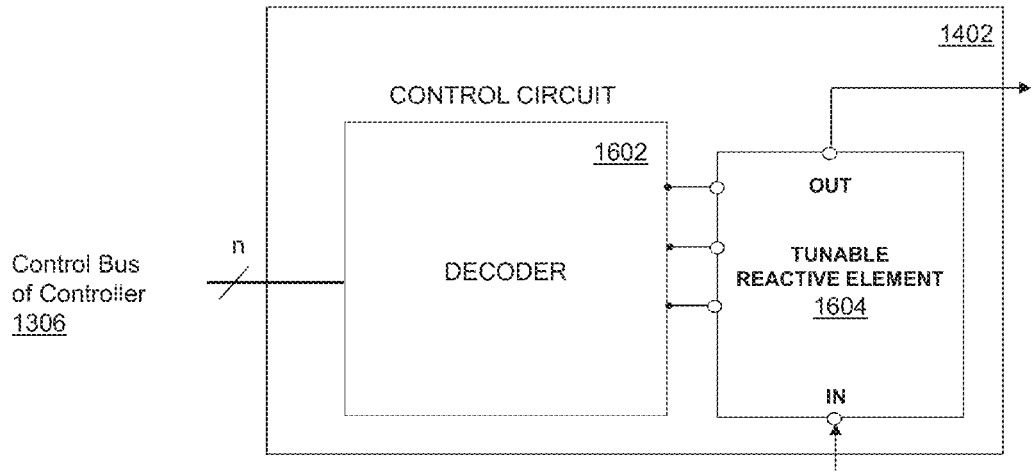
Figure 17:
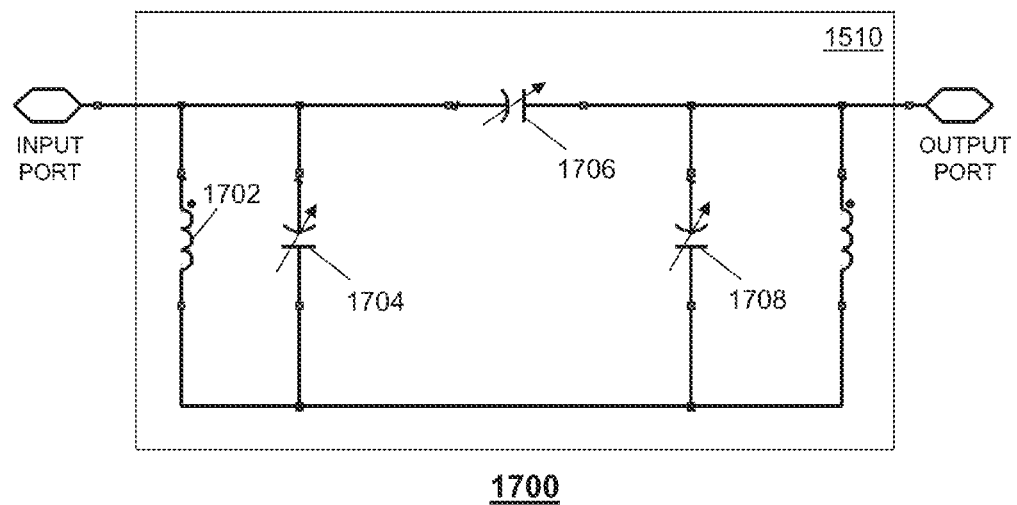
FIGS. 17-18 depict illustrative embodiments of a tunable reactive element of the tunable matching network of FIGS. 15-16.

FIGS. 15-16 depict illustrative embodiments of the tunable matching network 1402 of the transceiver 1302 of FIG. 14. In one embodiment, the tunable matching network 1402 can comprise a control circuit 1502 and a tunable reactive element 1510. The control circuit 1502 can comprise a DC-to-DC converter 1504, one or more digital to analog converters (DACs) 1506 and one or more corresponding buffers 1508 to amplify the voltage generated by each DAC. The amplified signal can be fed to one or more tunable reactive components 1704, 1706 and 1708 such as shown in FIG. 17, which depicts a possible circuit configuration for the tunable reactive element 1510. In this illustration, the tunable reactive element 1510 includes three tunable capacitors 1704, 1706, 1708 and an inductor 1702 with a fixed inductance. Other circuit configurations are possible, including use of other components, and are thereby contemplated by the present disclosure.

The tunable capacitors 1704, 1706, 1708 can each utilize technology that enables tunability of the capacitance of said component. One embodiment of the tunable capacitors 1704, 1706, 1708 can utilize voltage or current tunable dielectric materials such as a composition of barium strontium titanate (BST). An illustration of a BST composition is the Parascan® Tunable Capacitor. In another embodiment, the tunable reactive element 1510 can utilize semiconductor varactors. Other present or next generation methods or material compositions that can support a means for a voltage or current tunable reactive element are contemplated by the present disclosure.

The DC-to-DC converter 1504 can receive a power signal such as 3 Volts from the power supply 1314 of the communication device 1300 in FIG. 13. The DC-to-DC converter 1504 can use common technology to amplify this power signal to a higher range (e.g., 30 Volts) such as shown. The controller 1306 can supply digital signals to each of the DACs 1506 by way of a control bus of "n" or more wires to individually control the capacitance of tunable capacitors 1704, 1706, 1708, thereby varying the collective reactance of the tunable matching network 1402. The control bus can be implemented with a two-wire common serial communications technology such as a Serial Peripheral Interface (SPI) bus. With an SPI bus, the controller 1306 can submit serialized digital signals to configure each DAC in FIG. 15 or the switches of the tunable reactive element 1604 of FIG. 16. The control circuit 1502 of FIG. 15 can utilize common digital logic to implement the SPI bus and to direct digital signals supplied by the controller 1306 to the DACs.

Figure 18:
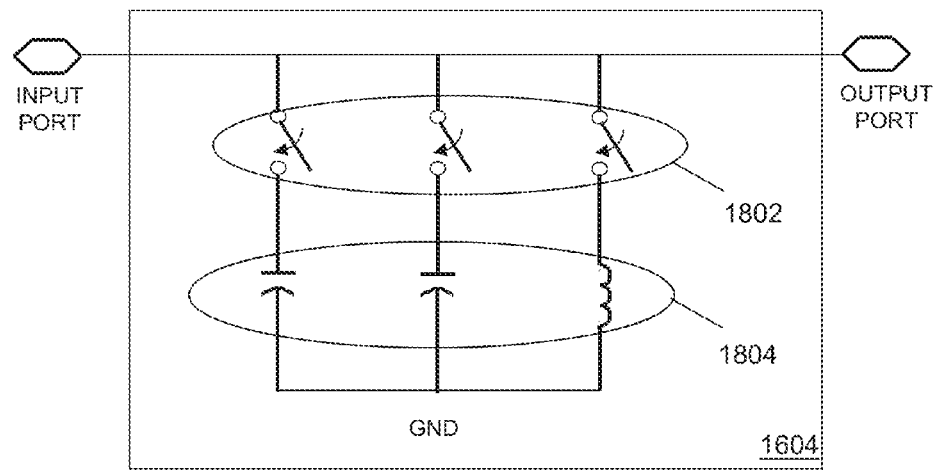

In another embodiment, the tunable matching network 1402 can comprise a control circuit 1602 in the form of a decoder and a tunable reactive element 1604 comprising switchable reactive elements such as shown in FIG. 18. In this embodiment, the controller 1306 can supply the control circuit 1602 signals via the SPI bus which can be decoded with Boolean or state machine logic to individually enable or disable the switching elements 1802. The switching elements 1802 can be implemented using various types of switches, such as semiconductor switches or micro-machined switches including those utilized in micro-electromechanical systems (MEMS). By independently enabling and disabling the reactive elements (capacitors and/or inductors 1804) of FIG. 18 with the switching elements 1802, the collective reactance of the tunable reactive element 1604 can be varied.

The tunability of the tunable matching network 1402 provides the controller 1306 a means to optimize performance parameters of the transceiver 1202 such as, for example, but not limited to, transmitter power, transmitter efficiency, receiver sensitivity, power consumption of the communication device, a specific absorption rate (SAR) of energy by a human body, frequency band performance parameters, and so forth. To achieve one or more desirable performance characteristics which can be defined, the communication device 1300 can utilize a tuning state selection method, such as depicted in FIGS. 2-4 and 7.

Other algorithms can be used for selecting a desired tuning value, and which may resolve any inaccuracy in determining a particular use case that affects the antenna environment and resulting antenna performance. For instance, the radio frequency and/or other RF information (e.g., band and sub-band) can be determined, and one or more usage conditions or factors such as, for example, but not limited to, audio path configuration, user interface mode of operation, and radio bearer type, can be used to determine a number of tuning state candidates, which have the highest probability of matching the actual environment of the communication device. An example of this algorithm is described in U.S. patent application Ser. No. 13/030,177 to Hoirup et al. filed on Feb. 18, 2011, the disclosure of which is hereby incorporated by reference.

In one or more embodiments, the look-up table that includes the group of smaller tuning steps based on modulation types can be static and/or dynamic. For example, the look-up table can be pre-loaded into the memory of the communication device based on known or estimated factors including modulation type, use cases, usage conditions or factors, and so forth. In another example, the look-up table can be populated or adjusted based on values determined during operation of the communication device, such as from a remote source transmitting the data, including a base station.

In one embodiment, the desired tuning value can be determined based on RSSI, Received Signal Code Power (RSCP), Received Signal Quality (RXQUAL), Received Bit Error Rate, current drain, transmit power control level, and so forth as parameters to select a desired tuning value via a look-up table. In addition, feedback from a cellular base station can be utilized in the tuning process. For instance, if the handset is directed to transmit at a lower power step with one tuning state than another, that information could be utilized to determine which tuning state provides a better match for the handset transmitter. In one or more embodiments, the algorithm can set the tuning state and sample the parameter(s) resulting from that tuning state change. In one embodiment, at least one sample for each tuning state setting can be utilized. More samples may also be utilized in which case the sample order can be interleaved where n different possible tuning states can be set and RSSI or other parameter(s) measured for each, with each of the n states repeated m times. The resultant m measurements for each state can be then be averaged or otherwise processed in order to determine which tuning state will be chosen as the preferred state.

In one or more embodiments, the desired tuning step or value can be identified or otherwise determined based on various goals, such as one or more of a better pre-determined antenna match (e.g., 50Ω) for each radio Tx/Rx band, achieving better TRP/TIS in the various use cases (e.g., free space, handheld, and other limited modes of operation), a better or best Quality of Service (QoS) with a lower or lowest power consumption. For example, radiated UL throughput can be compared with a desired UL throughput (e.g., a throughput threshold), such as through use of RSSI measurement, to determine whether tuning is to be performed to improve or maintain the radiated UL throughput. One or more of the exemplary embodiments can take into account that an optimized TRP and/or TIS may not provide the best user experience and can determine the desired tuning step or value accordingly. In one or more embodiments, the best user experience can be defined by quality of service parameters, such as voice quality and/or data throughput. QoS may not be directly proportional or otherwise 100% related to TRP and TIS, which are just two variables of QoS function.

In one or more embodiments, the desired tuning step or value can be obtained from one or more look-up tables 2000 as depicted in FIG. 20. In one embodiment, the look-up table 2000 can be indexed (e.g., by the controller 1306 of the communication device 1300 of FIG. 13) during operation according to band and/or use case. The look-up table 2000 can be static and/or dynamic. For example, the look-up table 2000 can be pre-loaded into the memory of the communication device 1300 based on known or estimated use cases, usage conditions or factors, and so forth. In another example, the look-up table 2000 can be populated or adjusted based on values determined during operation of the communication device 1300. The desired tuning step can be based on a subset of use cases that are selected from a group of use cases stored in a memory of the communication device, such as in table 2000.

In one embodiment, a method is provided in which a controller can determine an adjustment to be made to an impedance matching network of a communication device that is utilizing Code Division Multiple Access (CDMA) communication, and in which the controller can adjust the impedance matching network while the communication device is performing at least one of receiving or transmitting signals, where at least two adjacent frames of the CDMA communication have different variable reactance values for the impedance matching network. In one embodiment, the method can include the controller determining a reactance change per frame of the CDMA communication based on an amount of distortion of an RF signal caused by the reactance change.

Figure 21A:
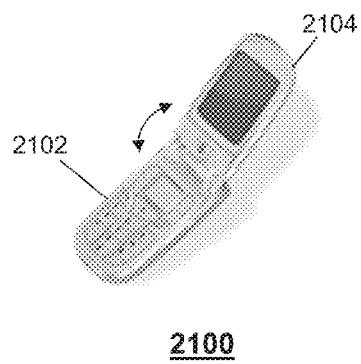
FIGS. 21a-24 depict illustrative physical and operational use cases of the communication devices of FIGS. 1 and 13.
Figure 21B:
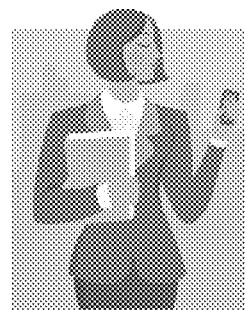
Figure 21C:
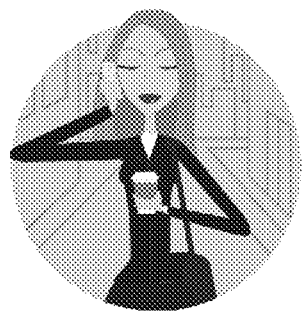
Figure 21D:
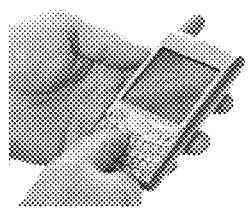
Figure 21E:
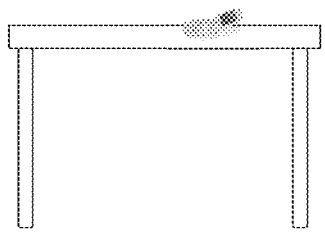

In one or more embodiments, a physical use case that is utilized in determining the desired tuning step or value can represent a physical state of the communication device, while a functional use case can represent an operational state of the communication device. For example, for a flip phone 2100 of FIG. 21*a*, an open flip can represent one physical use case, while a closed flip can represent another physical use case. In a closed flip state (i.e., bottom and top flips 2102-2104 are aligned), a user may have his/her hands surrounding the top flip 2102 and the bottom flip 2104 while holding the phone 2100, which can result in one range of load impedances experienced by an internal or retrievable antenna (not shown) of the phone 2100. The range of load impedances of the internal or retrievable antenna can be determined by empirical analysis. With the flip open a user may hold the bottom flip 2102 with one hand while positioning the top flip 2104 near the user's ear when an audio system of the phone 2100 is set to low volume. If, on the other hand, the audio system is in speakerphone mode, the user may be positioning the top flip 2104 away from the user's ear. In these arrangements, different ranges of load impedances can be experienced by the internal or retrievable antenna, which can be analyzed empirically. The low and high volume states of the audio system illustrate varying functional use cases. Other examples of use cases can include handheld operations such as shown by FIG. 21B, handheld and phone-to-head operations such as shown in FIG. 21C, handheld and typing operations as shown in FIG. 21D, and operations while on a metal table as shown in FIG. 21E. These are a few examples of use cases and more use cases can be determined or detected in the exemplary embodiments. In one or more embodiments, the determined or detected use case can be either or both of a physical or functional use case.

Figure 22:
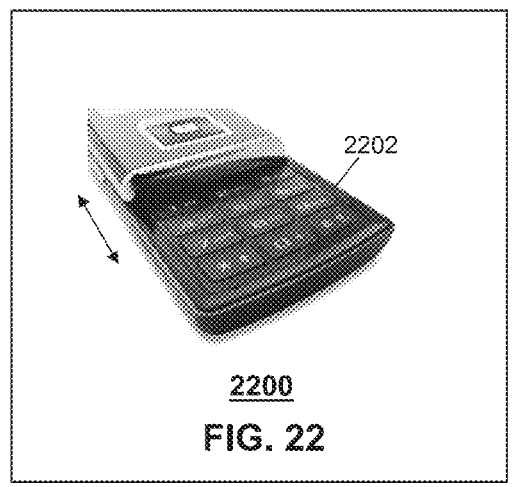
Figure 23:
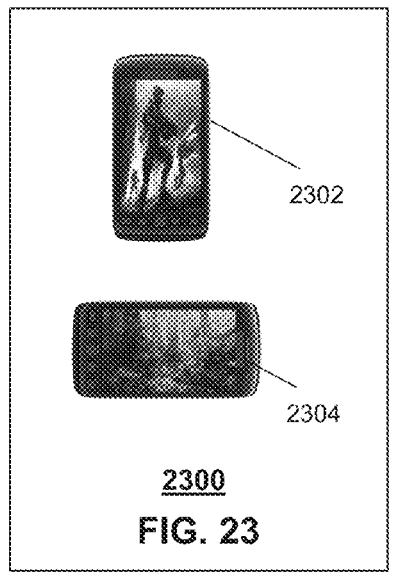
Figure 24:
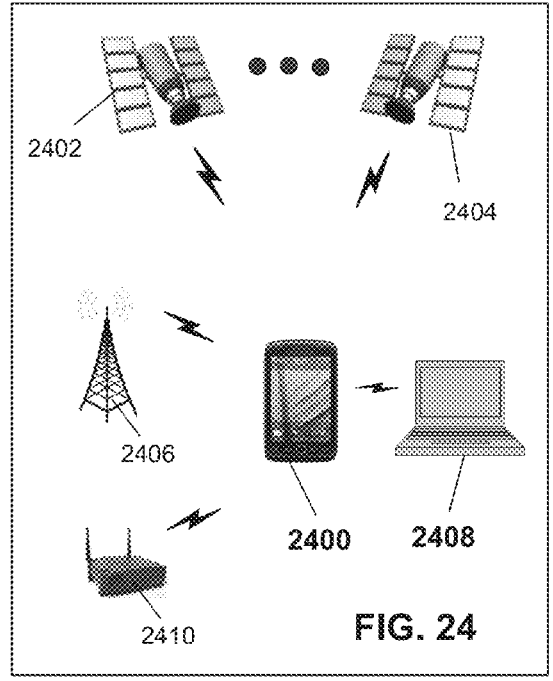

For a phone 2200 with a slideable keypad 2202 (illustrated in FIG. 22), the keypad in an outward position can present one range of load impedances of an internal antenna, while the keypad in a hidden position can present another range of load impedances, each of which can be analyzed empirically. For a smartphone 2300 (illustrated in FIG. 23) presenting a video game, the user may hold the phone away from the user's ear in order to view the game. Placing the smartphone 2300 in a portrait position 2302 can represent one physical and operational use case, while utilizing the smartphone 2300 in a landscape position 2304 presents another physical and operational use case.

A multimode phone 2400 capable of facilitating multiple access technologies such as GSM, CDMA, LTE, WiFi, GPS, and/or Bluetooth in two or more combinations can provide additional insight into possible ranges of impedances experienced by two or more internal antennas of the multimode phone 2400. For example, a multimode phone 2400 that provides GPS services by processing signals received from a constellation of satellites 2402, 2404 can be empirically analyzed when other access technologies are also in use. Suppose, for instance, that while navigation services are enabled, the multimode phone 2400 is facilitating voice communications by exchanging wireless messages with a cellular base station 2406. In this state, an internal antenna of the GPS receiver may be affected by a use case of a user holding the multimode phone 2400 (e.g., near the user's ear or away from the user's ear). The effect on the GPS receiver antenna and the GSM antenna by the user's hand position can be empirically analyzed.

Suppose in another scenario that the antenna of a GSM transceiver is in close proximity to the antenna of a WiFi transceiver. Further assume that the GSM frequency band used to facilitate voice communications is near the operational frequency of the WiFi transceiver. Also assume that a use case for voice communications may result in certain physical states of the multimode phone 2400 (e.g., slider out), which can result in a particular hand position of the user of the multimode phone 2400. Such a physical and functional use case can affect the impedance range of the antenna of the WiFi transceiver as well as the antenna of the GSM transceiver.

A close proximity between the WiFi and GSM antennas and the near operational frequency of the antennas may also result in cross-coupling between the antennas, thereby changing the load impedance of each of the antennas. Cross-coupling under these circumstances can be measured empirically. Similarly, empirical measurements of the impedances of other internal antennas can be measured for particular physical and functional use configurations when utilizing Bluetooth, WiFi, Zigbee, or other access technologies in peer-to-peer communications with another communication device 2408 or with a wireless access point 2410.

The number of physical and functional use cases of the communication device 1300 can be substantial when accounting for combinations of access technologies, frequency bands, antennas of multiple access technologies, antennas configured for diversity designs such as multiple-input and multiple output (MIMO) antennas, and so on. These combinations, however, can be empirically analyzed for load impedances and effects on other tunable circuits. The empirical data collected can be recorded in the look-up table of FIG. 20 and indexed according to corresponding combinations of physical and functional use cases. In one or more embodiments, the information stored in the look-up table can be used in open-loop RF tuning applications to initialize tunable circuit components of a transceiver, as well as, tuning algorithms that control operational aspects of the tunable circuit components.

Figure 25:
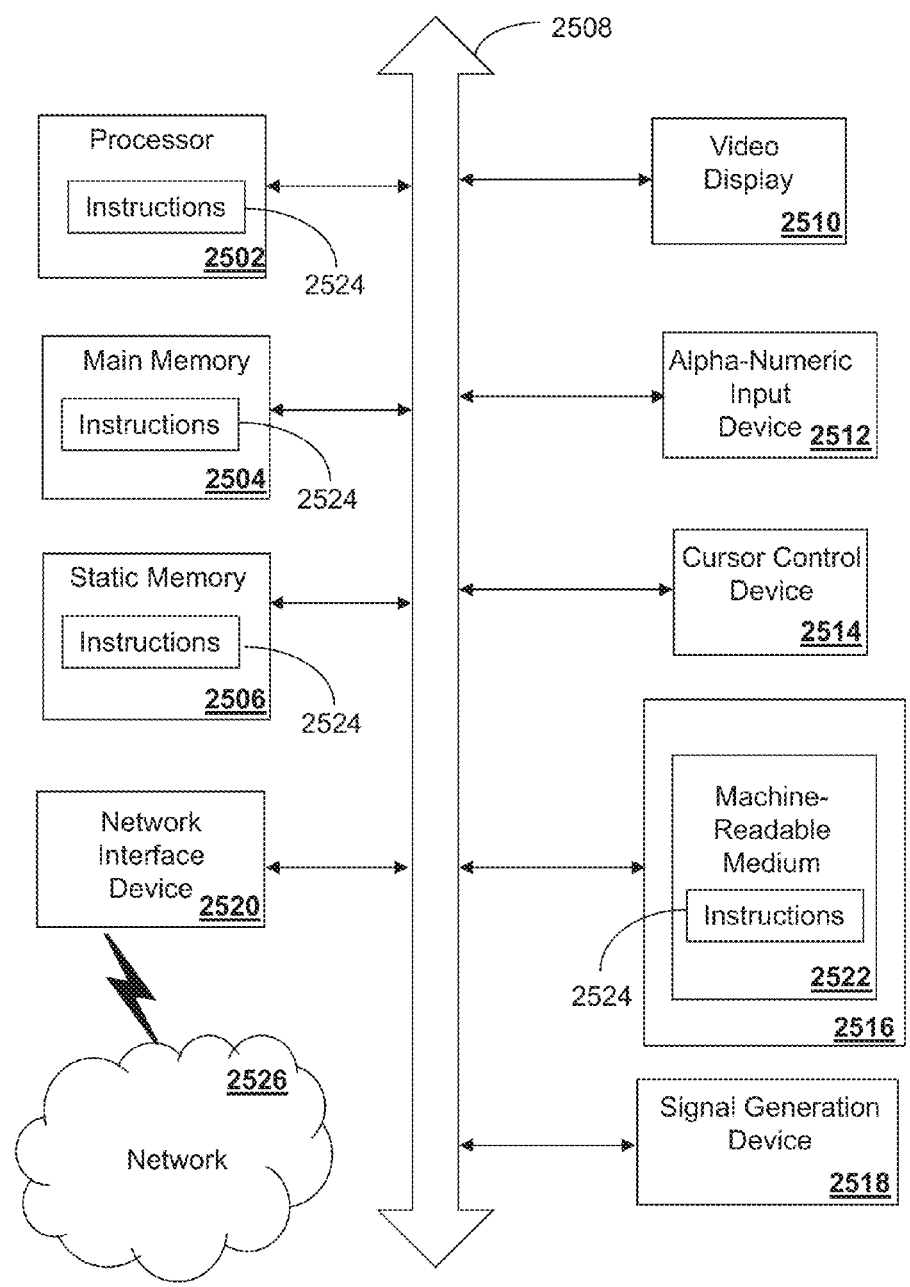
FIG. 25 depicts an exemplary diagrammatic representation of a machine in the form of a computer system within which a set of instructions, when executed, may cause the machine to perform any one or more of the methodologies disclosed herein.

FIG. 25 depicts an exemplary diagrammatic representation of a machine in the form of a computer system 2500 within which a set of instructions, when executed, may cause the machine to perform any one or more of the methodologies discussed above. In some embodiments, the machine operates as a standalone device. In some embodiments, the machine may be connected (e.g., using a network) to other machines. In a networked deployment, the machine may operate in the capacity of a server or a client user machine in server-client user network environment, or as a peer machine in a peer-to-peer (or distributed) network environment.

The machine may comprise a server computer, a client user computer, a personal computer (PC), a tablet PC, a laptop computer, a desktop computer, a control system, a network router, switch or bridge, or any machine capable of executing a set of instructions (sequential or otherwise) that specify actions to be taken by that machine. It will be understood that a device of the present disclosure includes broadly any electronic device that provides voice, video or data communication. Further, while a single machine is illustrated, the term "machine" shall also be taken to include any collection of machines that individually or jointly execute a set (or multiple sets) of instructions to perform any one or more of the methodologies discussed herein.

The computer system 2500 may include a processor 2502 (e.g., a central processing unit (CPU), a graphics processing unit (GPU), or both), a main memory 2504 and a static memory 2506, which communicate with each other via a bus 2508. The computer system 2500 may further include a video display unit 2510 (e.g., a liquid crystal display (LCD), a flat panel, a solid state display, or a cathode ray tube (CRT)). The computer system 2500 may include an input device 2512 (e.g., a keyboard), a cursor control device 2514 (e.g., a mouse), a disk drive unit 2516, a signal generation device 2518 (e.g., a speaker or remote control) and a network interface device 2520.

The disk drive unit 2516 may include a machine-readable medium 2522 on which is stored one or more sets of instructions (e.g., software 2524) embodying any one or more of the methodologies or functions described herein, including those methods illustrated above. The instructions 2524 may also reside, completely or at least partially, within the main memory 2504, the static memory 2506, and/or within the processor 2502 during execution thereof by the computer system 2500. The main memory 2504 and the processor 2502 also may constitute machine-readable media.

Dedicated hardware implementations including, but not limited to, application specific integrated circuits, programmable logic arrays and other hardware devices can likewise be constructed to implement the methods described herein. Applications that may include the apparatus and systems of various embodiments broadly include a variety of electronic and computer systems. Some embodiments implement functions in two or more specific interconnected hardware modules or devices with related control and data signals communicated between and through the modules, or as portions of an application-specific integrated circuit. Thus, the example system is applicable to software, firmware, and hardware implementations.

In accordance with various embodiments of the present disclosure, the methods described herein are intended for operation as software programs running on a computer processor. Furthermore, software implementations can include, but not limited to, distributed processing or component/object distributed processing, parallel processing, or virtual machine processing can also be constructed to implement the methods described herein.

The present disclosure contemplates a machine readable medium containing instructions 2524, or that which receives and executes instructions 2524 from a propagated signal so that a device connected to a network environment 2526 can send or receive voice, video or data, and to communicate over the network 2526 using the instructions 2524. The instructions 2524 may further be transmitted or received over a network 2526 via the network interface device 2520.

While the machine-readable medium 2522 is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding or carrying a set of instructions for execution by the machine and that cause the machine to perform any one or more of the methodologies of the present disclosure.

The term "machine-readable medium" shall accordingly be taken to include, but not be limited to: solid-state memories such as a memory card or other package that houses one or more read-only (non-volatile) memories, random access memories, or other re-writable (volatile) memories; magneto-optical or optical medium such as a disk or tape; and/or a digital file attachment to e-mail or other self-contained information archive or set of archives is considered a distribution medium equivalent to a tangible storage medium. Accordingly, the disclosure is considered to include any one or more of a machine-readable medium or a distribution medium, as listed herein and including art-recognized equivalents and successor media, in which the software implementations herein are stored.

Although the present specification describes components and functions implemented in the embodiments with reference to particular standards and protocols, the disclosure is not limited to such standards and protocols. Each of the standards for Internet and other packet switched network transmission (e.g., TCP/IP, UDP/IP, HTML, HTTP) represent examples of the state of the art. Such standards are periodically superseded by faster or more efficient equivalents having essentially the same functions. Accordingly, replacement standards and protocols having the same functions are considered equivalents.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. Other embodiments may be utilized and derived therefrom, such that structural and logical substitutions and changes may be made without departing from the scope of this disclosure. For example, components and/or steps from different embodiments may be combined. Figures are also merely representational and may not be drawn to scale. Certain proportions thereof may be exaggerated, while others may be minimized. Accordingly, the specification and drawings are to be regarded in an illustrative rather than a restrictive sense.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A mobile communication device, comprising:
   an antenna;
   a transceiver coupled with the antenna;
   a matching network coupled with the transceiver and the antenna, wherein the matching network includes a variable reactance element; and
   a controller coupled with the matching network, wherein the controller determines a desired tuning step to be applied to the matching network to adjust a variable reactance of the variable reactance element, wherein the controller determines a phase shift criteria associated with a modulation being implemented by the mobile communication device, wherein the controller selects a group of tuning steps based on satisfying the phase shift criteria and based on adding up to equal the determined desired tuning step, wherein the selection of the group of tuning steps is performed by the controller prior to the controller initiating an adjustment of the variable reactance element based on the selected group of tuning steps, wherein the phase shift criteria is a maximum phase shift limit for each tuning step of the group of tuning steps, and wherein the variable reactance of the variable reactance element is adjusted utilizing the group of tuning steps applied in sequence, wherein a first tuning step of the group of tuning steps has a different step size than a second tuning step of the group of tuning steps, and wherein the controller via a single write command provides a rate of tuning adjustment that represents the selected group of tuning steps and that causes the variable reactance of the variable reactance element to be adjusted.

2. The mobile communication device of claim 1, wherein the controller determines a maximum amplitude shift limit associated with the modulation, and wherein the selection of the group of tuning steps by the controller includes selecting the group of tuning steps that does not exceed the maximum amplitude shift limit.

3. The mobile communication device of claim 2, comprising a memory, wherein the controller identifies the maximum phase shift limit and the maximum amplitude shift limit from a table stored in the memory, wherein the table is indexed based on a modulation type, and wherein the group of tuning steps enables achieving the desired tuning step within a single radio frame.

4. The mobile communication device of claim 1, wherein the variable reactance element comprises a switch and a group of reactance elements including a capacitor, an inductor, or a combination thereof.

5. The mobile communication device of claim 4, wherein the selection of the group of tuning steps by the controller comprises utilizing an adjustable R-C time constant to determine an adjustment of a transition between steps of the group of tuning steps.

6. The mobile communication device of claim 1, wherein the variable reactance element comprises a voltage tunable capacitor.

7. The mobile communication device of claim 6, further comprising a digital-to-analog converter (DAC) coupled with the matching network, wherein the controller via the single write command provides the rate of tuning adjustment to the DAC that represents the selected group of tuning steps, and wherein the DAC generates corresponding bias voltages representing the selected group of tuning steps that adjust the variable reactance of the variable reactance element.

8. The mobile communication device of claim 6, wherein the variable reactance of the variable reactance element is adjusted utilizing the selected group of tuning steps responsive to the controller detecting an absence of a frequency change during the modulation.

9. The mobile communication device of claim 1, wherein the variable reactance of the variable reactance element is adjusted by the controller utilizing the group of tuning steps for both a transmit mode and a receive mode of the mobile communication device.

10. The mobile communication device of claim 9, wherein the variable reactance element includes a voltage tunable capacitor.

11. The mobile communication device of claim 1, further comprising a measurement component to obtain an operational parameter of the mobile communication device, wherein the controller determines the desired tuning step based on the operational parameter.

12. The mobile communication device of claim 11, wherein the measurement component is connected with a directional coupler.

13. A method, comprising:
determining, by a controller of a mobile communication device, a phase shift criteria and an amplitude shift criteria associated with a modulation being implemented by the mobile communication device;
determining, by the controller, a desired tuning step for a matching network of the mobile communication device; and
responsive to the determining of the desired tuning step, determining, by the controller, a group of tuning steps based on satisfying the phase and amplitude shift criteria and based on adding up to equal the determined desired tuning step, wherein the phase and amplitude shift criteria are maximum phase and amplitude shift limits, and wherein the determining of the group of tuning steps by the controller comprises generating a single write command by the controller that includes an adjustable R-C time constant to implement an adjustment of a transition between steps of the group of tuning steps, wherein a first tuning step of the group of tuning steps has a different step size than a second tuning step of the group of tuning steps.

14. The method of claim 13, comprising storing a table in a memory of the mobile communication device, wherein the controller determines the phase shift criteria and the amplitude shift criteria from the table according to the modulation.

15. The method of claim 13, comprising:
providing, by the controller, a rate of tuning adjustment in the single write command that represents the group of tuning steps to a Digital-to-Analog Convertor (DAC) of the mobile communication device;
generating, by the DAC, bias voltages corresponding to the group of tuning steps based on the rate of tuning adjustment; and
providing, by the DAC, the bias voltages to a variable reactance element of the matching network to adjust a variable reactance of the variable reactance element.

16. The method of claim 13, further comprising adjusting a variable reactance of a variable reactance element of the matching network based on the determined group of tuning steps responsive to a detection of an absence of a frequency change during the modulation, wherein the group of tuning steps enables achieving the desired tuning step within a single radio frame.

17. The method of claim 13, comprising:
determining a use case for the mobile communication device; and
determining the desired tuning step based on the determined use case.

18. A mobile communication device, comprising:
a memory storing a look-up table, wherein the look-up table is indexed based on a modulation type;
a matching network having a voltage tunable capacitor; and
a controller coupled with the memory and the matching network, wherein the controller determines a desired tuning step to be applied to the matching network to adjust a variable capacitance of the voltage tunable capacitor, wherein the controller determines maximum phase and amplitude shift limits associated with a modulation being implemented by the mobile communication device based on the look-up table, and wherein the controller generates a single control signal that applies a group of tuning steps that does not exceed the maximum phase and amplitude shift limits and that cumulatively provides the determined desired tuning step, wherein a first tuning step of the group of tuning steps has a different step size than a second tuning step of the group of tuning steps.

19. The mobile communication device of claim 18, wherein the control signal includes an adjustable R-C time constant.

20. The mobile communication device of claim 18, further comprising a digital-to-analog converter for generating corresponding bias voltages representing the group of tuning steps.

* * * * *